United States Patent
Yamaguchi et al.

(10) Patent No.: US 6,753,574 B2
(45) Date of Patent: Jun. 22, 2004

(54) SEMICONDUCTOR DEVICE AND METHOD FOR FABRICATING THE SAME

(75) Inventors: Seiichiro Yamaguchi, Kawasaki (JP); Mitsuaki Kai, Kawasaki (JP); Isao Amano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 194 days.

(21) Appl. No.: 09/815,010

(22) Filed: Mar. 23, 2001

(65) Prior Publication Data

US 2002/0048972 A1 Apr. 25, 2002

(30) Foreign Application Priority Data

Oct. 25, 2000 (JP) ........................................ 2000-325801

(51) Int. Cl.[7] .............................................. H01L 29/76
(52) U.S. Cl. ..................... 257/331; 257/374; 257/330; 257/341; 257/332; 257/333; 257/371; 257/372
(58) Field of Search ................................ 257/374, 371, 257/372, 331, 332, 341, 401, 520, 622, 330, 333; 438/272, 589, 527, 682, 307, 270, 283

(56) References Cited

U.S. PATENT DOCUMENTS

| 5,316,959 | A | * | 5/1994 | Kwan et al. ................ 438/270 |
| 5,382,536 | A | * | 1/1995 | Malhi et al. ................ 438/283 |
| 5,468,982 | A | * | 11/1995 | Hshieh et al. ............... 257/331 |
| 5,578,851 | A | * | 11/1996 | Hshieh et al. ............... 257/330 |
| 5,877,528 | A | * | 3/1999 | So .............................. 257/341 |
| 5,904,525 | A | * | 5/1999 | Hshieh et al. .............. 438/272 |
| 6,204,138 | B1 | * | 3/2001 | Krishnan et al. ........... 438/307 |
| 6,426,532 | B1 | * | 7/2002 | Iwata et al. ................. 257/374 |

FOREIGN PATENT DOCUMENTS

| JP | Hei 07-221314 A | 8/1995 |
| JP | Hei 08-125187 A | 5/1996 |

* cited by examiner

*Primary Examiner*—Matthew Smith
*Assistant Examiner*—V. Yevsikov
(74) *Attorney, Agent, or Firm*—Westerman, Hattori, Daniels & Adrian, LLP

(57) ABSTRACT

The semiconductor device includes: a conducting layer including: a channel region; a source region and a drain region sandwiching the channel region; and a body region connected to the channel region and being adjacent to the source region and the drain region; a gate electrode formed above the channel region interposing a gate insulation film therebetween; a dummy electrode formed on the body region near the interface between at least the drain region and the body region, and electrically insulated with the gate electrode; and a body contact region formed in the body region except a region where the dummy electrode is formed. The gate electrode and the dummy electrode are electrically insulated with each other, whereby the semiconductor device having body contacts can have a gate capacitance much decreased. Accordingly, deterioration of the speed performance of the transistors can be suppressed.

18 Claims, 31 Drawing Sheets

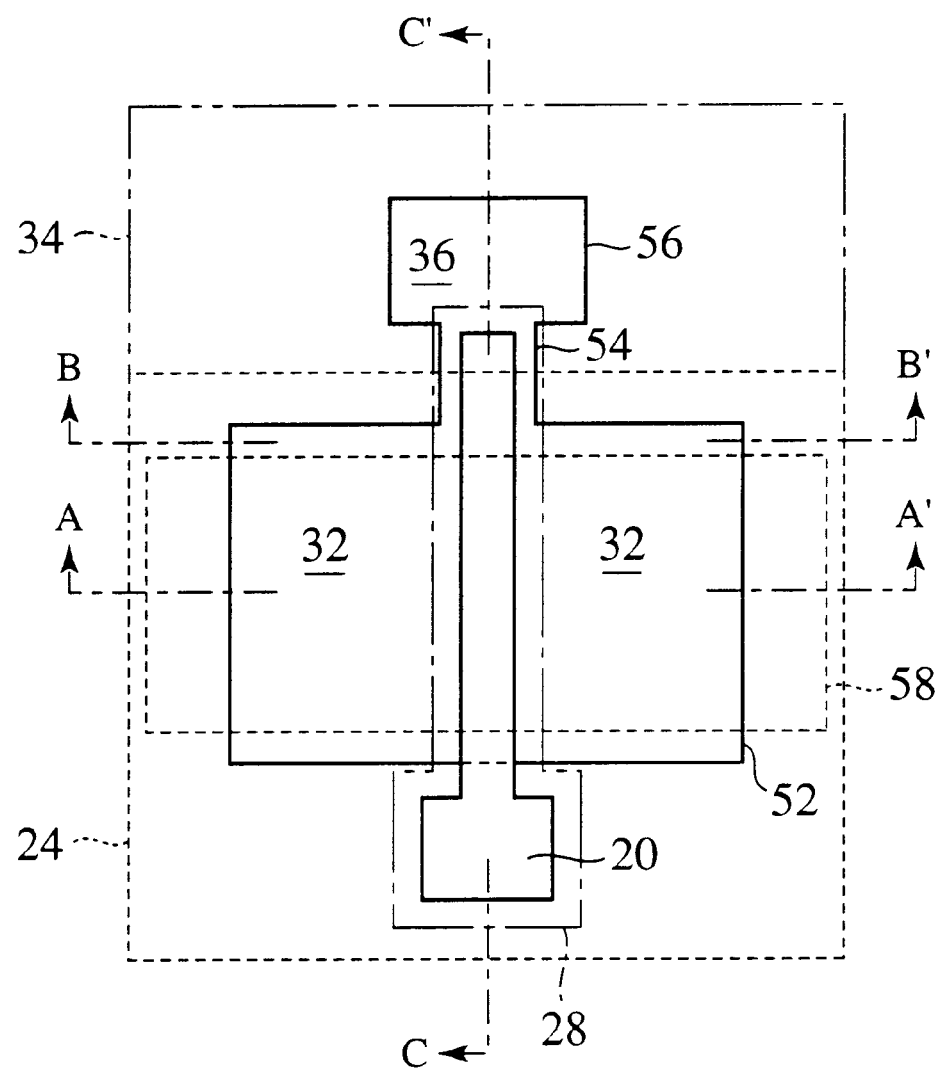

SEMICONDUCTOR DEVICE AND METHOD FOR FABRICATING THE SAME

BACKGROUND OF THE INVENTION

The present invention relates to a semiconductor device having body contacts and a method for fabricating the semiconductor device, more specifically to a semiconductor device which has a reduced gate capacitance and suppresses speed performance deterioration of the transistors, and a method for fabricating the semiconductor device.

Recently, as semiconductor devices are larger-scaled and more integrated, semiconductor integrated circuits are made to have higher performances and lower electric power consumption. It is proposed to use SOI (Silicon On Insulator) substrates. The SOI substrate is a substrate having a thin semiconductor layer formed on an insulation layer. The SOI substrate, which permits a device isolation film arriving at the insulation layer to fully isolate devices from each other, and also permits a dopant diffused layer formed in regions arriving at the insulation layer to much reduce junction leak current and junction capacitances. Thus, the SOI substrate is suitable for semiconductor devices requiring high speed operations. The devices formed on the semiconductor layer are isolated from the substrate by the insulation layer, with advantageous results of high α-ray resistance and latch-up resistance.

On the other hand, in a MOSFET using the SOI substrate, the potential of the body region floats, and potential changes in the body region affect the operation of the MOSFET. That is, secondary carriers, which are generated by impact ionization in the pinch-off region and are the same type as carriers in the channel region (holes in the NMOS and electrons in the PMOS) are accumulated in a lower region of the channel (the body region), which is electrically floated, and cause body potential changes (floating body effect). This floating body effect is a cause of device characteristic deviations, which makes margin design of a circuit difficult.

Various countermeasures to the floating body effect are proposed, but a method of providing an electrode in the body region so as to fix a potential is most secure and is generally used.

As one method of forming a contact to the body region, a region of a conduction type inverse to the source/drain region of the MOSFET (body contact region) is formed in the device region where the MOSFET is formed. The boundary between the body contact region and the source/drain region is covered with a gate electrode formed in a T-shape, L-shape or H-shape so as to isolate the device region and the body contact portion.

FIG. 30A shows a structure called the T-shape. One device region 100 is divided by a T-shaped gate electrode 108 in a source region 102, a drain region 104 and a body contact region 106. A device region below the gate electrode 108 (body region) is formed of a semiconductor layer of the same conduction type as the body contact region 106 and is electrically connected to the body contact region 106.

FIG. 30B shows a structure called the L-shape. One device region 100 is divided by an L-shaped gate electrode 108 in a source region 102 and a body contact region 108, and a drain region 104. A device region below a gate electrode 108 (body region) is formed of a semiconductor layer of the same conduction type as the body contact region 106 and electrically connected to the body contact region. Such structure is applicable to a semiconductor device which can set a source potential and a body potential at the same potential.

In these semiconductor devices, the gate electrodes 108 are extended to isolate the source region 102 or the drain region 104 from the body contact region 106. This is in consideration of salicide (self-aligned silicide) process. That is, in using salicide process, silicide film covers that of the device region 100 where the gate electrode 108, and a sidewall insulation film (not shown) formed on the side walls of the gate electrode 108 are not formed. Accordingly, unless the gate electrode 108 is formed so that the drain region is isolated from the body contact region 106, or the source region 102 and the drain region 104 are isolated from the body contact region 106, these regions are electrically connected to one another.

The gate electrode is thus extended, whereby the body contact region can be isolated from the drain region 104, or from the source region 102 and the drain region 104.

However, in the conventional semiconductor device shown in FIG. 30, the gate electrode is extended over the device region where the gate electrode does not play the role of the gate electrode with interposing the gate insulation film therebetween. A parasitic capacitance of this region is added to a gate capacitance of the MOSFET. That is, in the semiconductor device shown in FIG. 30A, when the T-shaped gate electrode 108 has the region at the longitudinal bar as the gate electrode 108 and the region at the lateral bar as a dummy electrode 108b, a parasitic capacitance Cp given by the dummy electrode 108b is connected parallelly with the MOSFET, and a gate capacitance is increased by the parasitic capacitance as shown in FIG. 31. The semiconductor device shown in FIG. 30B has the area of the dummy electrode 108b decreased, whereby the parasitic capacitance Cp can be decreased. The reduction of the parasitic capacitance Cp is not enough.

To implant ions in the source region 102 and the drain region 104, a lithography step for forming a mask pattern exposing the region 110 for the MOSFET to be formed in is necessary, and a mask pattern exposing the region 112 for the body contact to be formed in is necessary to implant ions in the body contact region 106. To secure disalignment margins in these lithography steps, as shown in FIG. 30 the ends of the patterns are positioned on the dummy electrode 108b. Accordingly, a width of the dummy electrode 108b must be set to be large enough for a disalignment margin, which adds much to a gate capacitance.

Thus, a semiconductor device having body contact regions has excessive additions to a gate capacitance and a junction capacitance, and the effect of parasitic capacitance reduction, which is a merit of using SOI substrates cannot be sufficiently used.

In the semiconductor devices shown in FIG. 30, a gate width of the MOSFET is defined by the gate electrode 108 on one side and is defined by the device region 100 on the other side. Accordingly, a gate width varies depending on the disalignment in the lithography step for forming the gate electrode 108.

On the other hand, as a device isolation technique which can control a insulation width and an insulation depth independently of each other, the so-called shallow trench isolation (STI) technique, in which a shallow trench is formed, and an insulation film is buried in the trench to form a device isolation film, is used. STI technique is superior to the conventional LOCOS in micronization, but has the problem that the channel width dependency of the electric characteristics, especially sub-threshold characteristics of MOSFET becomes higher (narrow channel effect). A main reason for this is that due to electric field concentration and disuniform impurity distribution taking place at the corners of the surface of the interface between the device isolation film and the device region, electric characteristics at these region differ from the intrinsic electric characteristics at the center of the channel. To solve this problem, the corners of the device region border are rounded, or etc. to thereby reduce the effect but insufficiently.

SUMMARY OF THE INVENTION

An object of the present invention is to provide a semiconductor device including a body contact, whose gate capacitance is small and which can suppress speed performance deterioration of the transistors, and a method for fabricating the semiconductor device.

Another object of the present invention is to provide a semiconductor device including a body contact having narrow channel effect reduced by using STI technique, and a method for fabricating the semiconductor device.

The above-described object is achieved by a semiconductor device comprising: a semiconductor layer including: a channel region; a source region and a drain region sandwiching the channel region; and a body region connected to the channel region and being adjacent to the source region and the drain region; a gate electrode formed above the channel region interposing a gate insulation film therebetween; a dummy electrode formed above the body region near an interface between the drain region and the body region, and electrically insulated with the gate electrode; and a body contact region formed in the body region except a region where the dummy electrode is formed.

The above-described object is also achieved by a semiconductor device comprising: a semiconductor layer including: a channel region; a source region and a drain region sandwiching the channel region; and a body region connected to the channel region and being adjacent to the source region and the drain region; a gate electrode formed above the channel region interposing a gate insulation film therebetween; a dummy electrode formed above the body region near an interface between the drain region and the body region, being integral with the gate electrode, and formed in a comb-shaped; and a body contact region formed in the body region except a region where the dummy electrode is formed.

The above-described object is also achieved by a semiconductor device comprising: a semiconductor layer including: a channel region; a source region and a drain region sandwiching the channel region; and a body region connected to the channel region and being adjacent to the source region and the drain region; a gate electrode formed above the channel region interposing a gate insulation film therebetween; a dummy electrode formed above the body region near an interface between the drain region and the body region, being integral with the gate electrode, and formed in a pattern having the inside cut out; and a body contact region formed in the body region except a region where the dummy electrode is formed.

The above-described object is also achieved by a semiconductor device comprising: a semiconductor layer including: a channel region; a source region and a drain region sandwiching the channel region; and a body region connected to the channel region and being adjacent to the source region and the drain region; a gate electrode formed above the channel region interposing a gate insulation film therebetween; a dummy electrode formed above the body region near an interface between the drain region and the body region, and being integral with the gate electrode; and a body contact region formed in the body region except a region where the dummy electrode is formed, a capacitance per a unit area of a capacitor formed by the dummy electrode being smaller than a capacitance per the unit area of a capacitor formed by the gate electrode.

The above-described object is also achieved by a semiconductor device comprising: a semiconductor layer including: a channel region; a source region and a drain region sandwiching the channel region; a body contact region; and a lead-out region interconnecting the channel region and the body contact region; a device isolation film formed, surrounding the bordering edge of the semiconductor layer; a gate electrode formed above the channel region interposing a gate insulation film therebetween; and a first sidewall insulation film formed on a side wall of the gate electrode, a width of the lead-out region being smaller than a sum of a width of the gate electrode and a width of the first sidewall insulation film formed on both sides of the gate electrode, and the lead-out region being covered by the gate electrode and the first sidewall insulation film.

The above-described object is also achieved by a method for fabricating a semiconductor device comprising the steps of: forming on a first conduction type substrate a device isolation film for defining a device region including a first region and a second region adjacent to the first region; forming above the device region a conducting film interposing a gate insulation film therebetween; patterning the conducting film to form a gate electrode in the first region and a dummy electrode in the second region near the interface between the first region and the second region, the dummy electrode being electrically insulated with the gate electrode; doping an impurity having a second conduction type different from the first conduction type in the first region with the gate electrode as a mask to form source/drain regions in the first region on both sides of the gate electrode; and doping an impurity having the first conduction type in the second region with the dummy electrode as a mask to form a body contact region in the second region.

The above-described object is also achieved by a method for fabricating a semiconductor device comprising the steps of: forming on a first conduction type substrate a device isolation film for defining a device region including a first region and a second region adjacent to the first region; depositing and patterning a first conducting film to form a gate electrode of the first conducting film above the first region; depositing and patterning a second conducting film to form a dummy electrode of the second conducting film above the second region near the interface between the first region and the second region; doping an impurity having a second conduction type different from the first conduction type in the first region with the gate electrode as a mask to form source/drain regions in the first region on both sides of the gate electrode; and doping an impurity having the first conduction type in the second region with the dummy electrode as a mask to form a body contact region in the second region.

The above-described object is also achieved by a method for fabricating a semiconductor device comprising the steps of: forming on a first conduction type substrate a device isolation film for defining a device region including a first region and a second region adjacent to the first region; forming a conducting film above the device region interposing a gate insulation film therebetween; patterning the conducting film to form a gate electrode in the first region and a comb-shaped dummy electrode in the second region near the interface between the first region and the second region, the dummy electrode being formed integral with the gate electrode; doping an impurity having a second conduction type different form the first conduction type in the first region with the gate electrode as a mask to form source/drain regions in the first region on both sides of the gate electrode; doping an impurity having the first conduction type in the second region with the dummy electrode as a mask to form a body contact region in the second region.

The above-described object is also achieved by a method for fabricating a semiconductor device comprising the steps of: forming on a first conduction type substrate a device isolation film for defining a device region including a first region and a second region adjacent to the first region; forming a conducting film above the device region interposing a gate insulation film therebetween; patterning the conducting film to form a gate electrode on the first region and a dummy electrode formed in a pattern having the inside cut out, formed on the second region near the interface between the first region and the second region, the dummy electrode being formed integral with the gate electrode; doping an impurity having a second conduction type different from the first conduction type in the first region with the gate electrode as a mask to form source/drain regions in the first region on both sides of the gate electrode; and doping an impurity having the first conduction type in the second region with the dummy electrode as a mask to form a body contact region in the second region.

The above-described object is also achieved by a method for fabricating a semiconductor device comprising the steps of: forming a device isolation film for defining a device region on a first conduction type substrate; forming a gate electrode above the device region interposing a gate insulation film therebetween; forming in the device region on both sides of the gate electrode a first impurity diffused region having a second conduction type different from the first conduction type, spaced from the device isolation film; forming a first sidewall insulation film on the side wall of the gate electrode; doping an impurity having the second conduction type in the device region with the gate electrode and the first sidewall insulation film as a mask to form a second impurity diffused region of the second conduction type which is deeper than the first impurity diffused region in the device region on both sides of the gate electrode.

In the present specification, a channel region is a region of the SOI layer between the source region and the drain region. A body region is a region of the SOI layer which is connected to the channel region and is adjacent to the source region or the drain region. A body contact region is a region of a body region, which is heavily doped. A region below the channel region is intrinsically the body region but, for the convenience of explanation, is often contained in the channel region in the present specification.

As described above, according to the present invention, a MOSFET is separated from a parasitic capacitor formed by the dummy electrode to thereby make a parasitic capacitance value low, whereby a semiconductor device having body contacts can have the gate capacitance much decreased. Accordingly, deterioration of speed performance of the transistors can be suppressed.

The shallow impurity diffused region of the extension source/drain structure or the lightly doped impurity diffused region of the LDD structure is formed, spaced from the device isolation film, whereby a threshold voltage of the bordering edge of the device region can be selectively increased. Accordingly, deterioration of sub-threshold characteristics due to electric field concentration near the end of the device isolation film can be suppressed.

BRIEF DESCRIPTION OF THE DRAWINGS

FIG. 20 is a plan view of the semiconductor device according to an eighth embodiment of the present invention, which shows a structure thereof.

DETAILED DESCRIPTION OF THE INVENTION

[A First Embodiment]

The semiconductor device according to a first embodiment of the present invention will be explained with reference to FIGS. 1, 2A–2C, 3, 4A–4B, 5A–5D, 6A–6C, 7A–7C, and 8A–8C.

Figure 1:
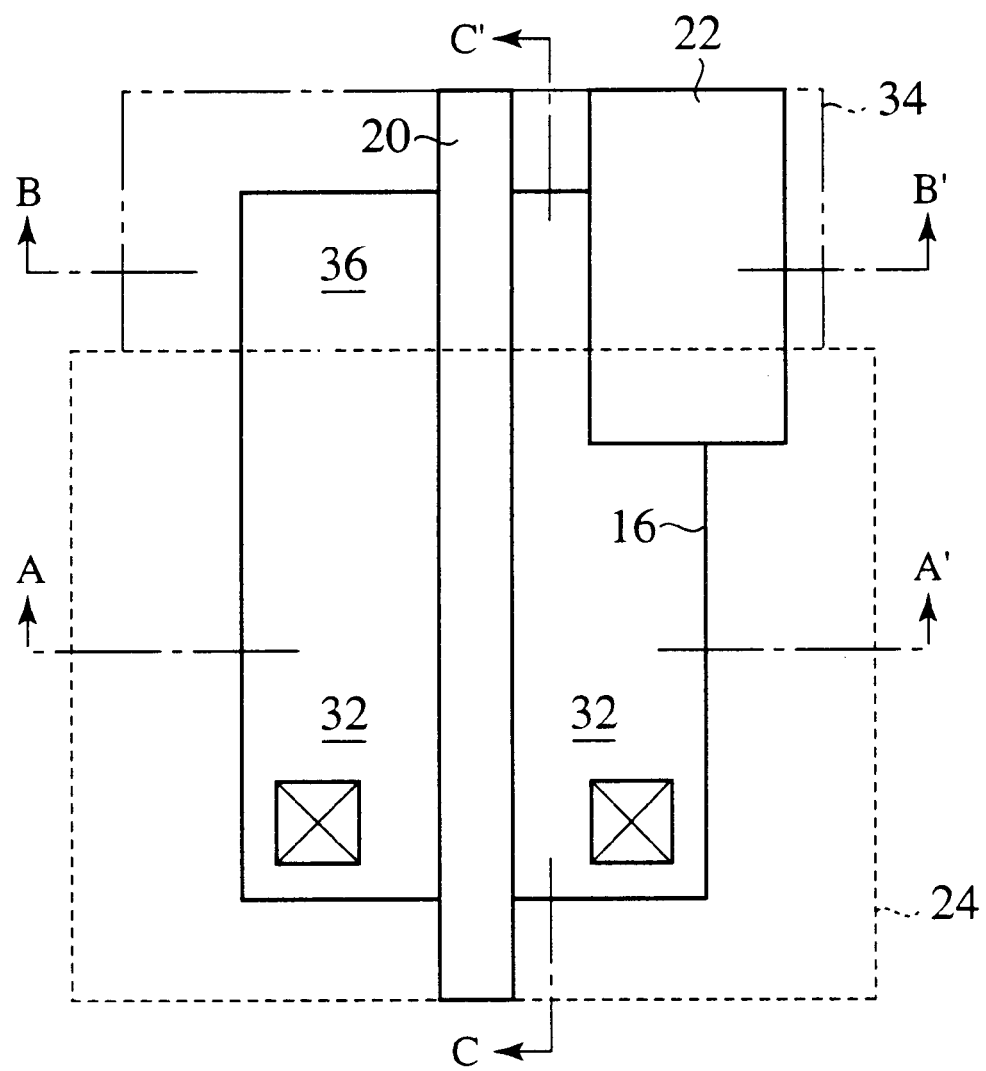
FIG. 1 is a plan view of the semiconductor device according to a first embodiment of the present invention, which shows a structure thereof.
Figure 2A:
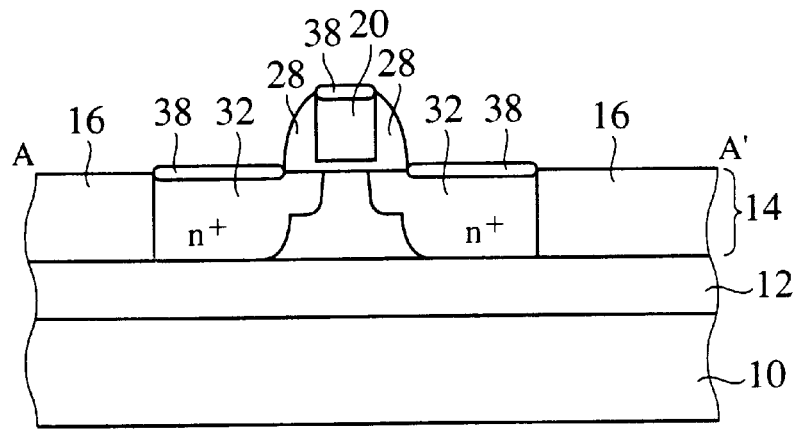
FIGS. 2A–2C are diagrammatic sectional views of the semiconductor device according to the first embodiment of the present invention, which show the structure thereof.
Figure 2B:
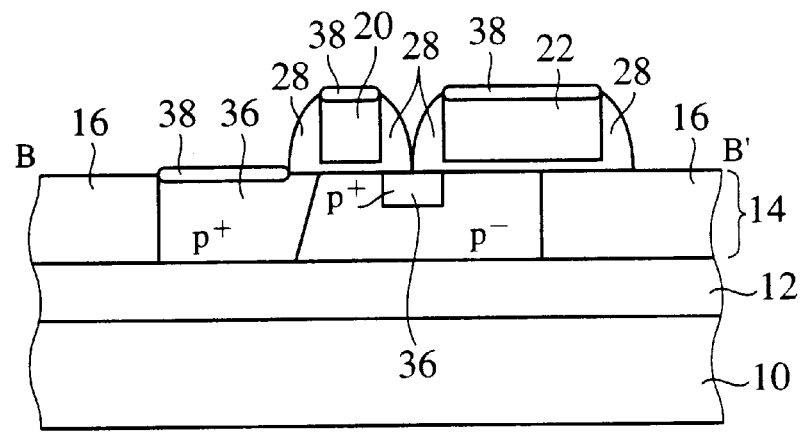
Figure 2C:
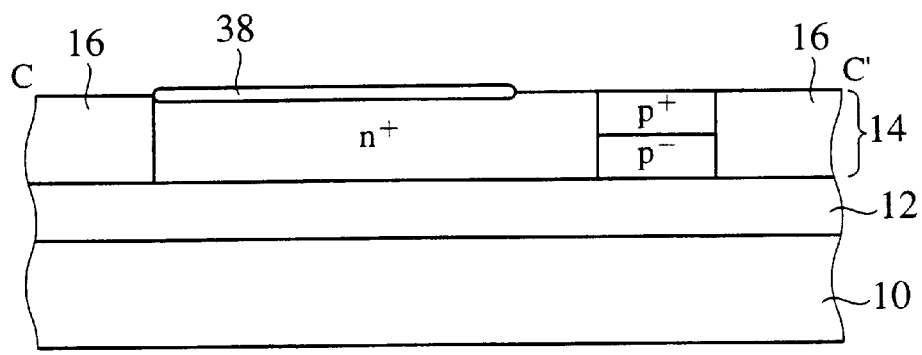
Figure 3:
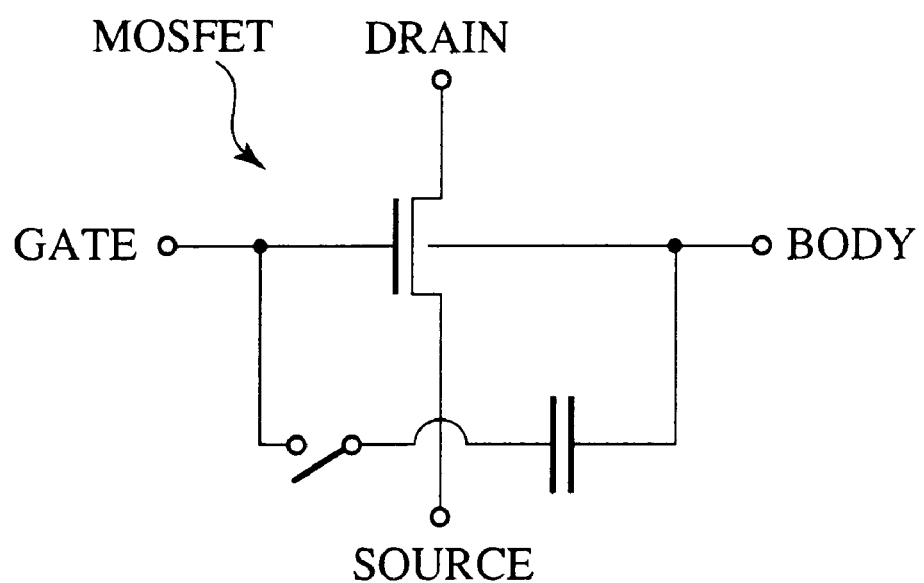
FIG. 3 is a circuit diagram of an equivalent circuit of the semiconductor device according to the first embodiment of the present invention.
Figure 4A:
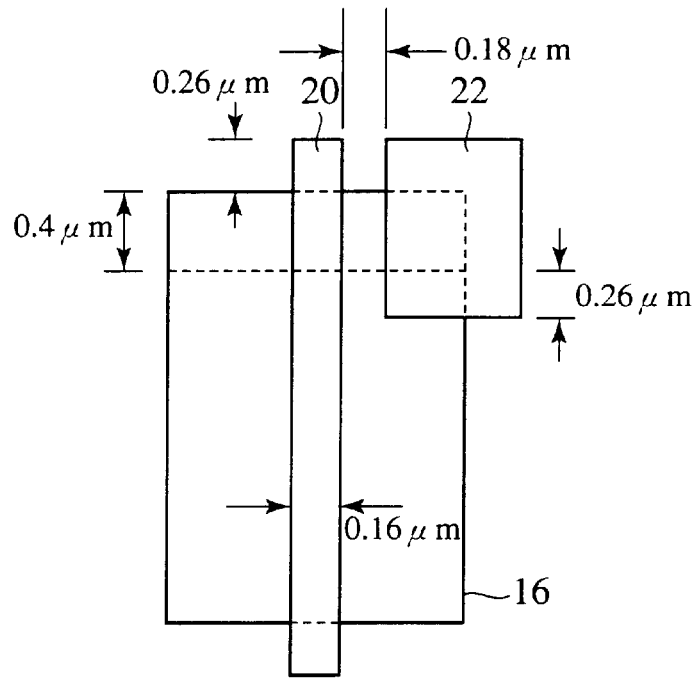
FIGS. 4A and 4B are plan views of the semiconductor device according to the first embodiment of the present invention and the conventional semiconductor device which show examples of parameters of the semiconductor device.
Figure 4B:
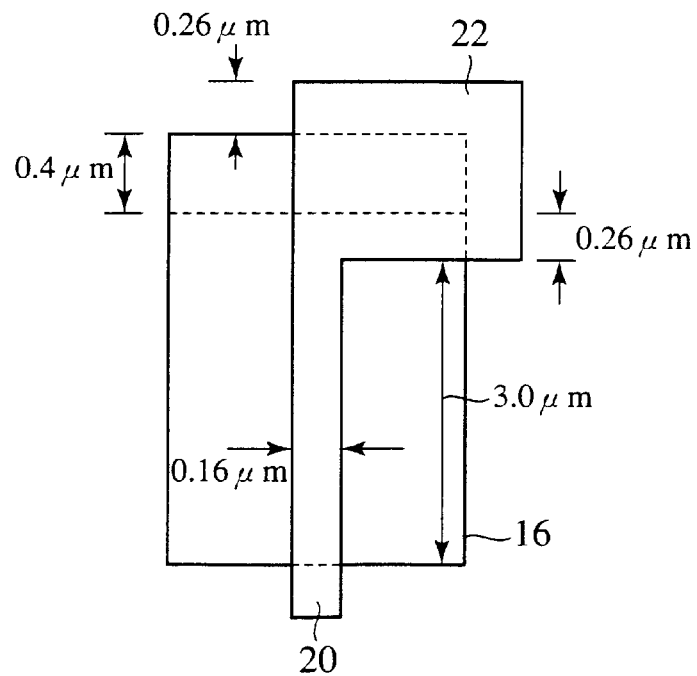

FIG. 1 is a plan view of the semiconductor device according to the present embodiment. FIGS. 2A–2C are diagrammatic sectional views of the semiconductor device according to the present embodiment, which show the structure thereof. FIG. 3 is a circuit diagram of an equivalent circuit of the semiconductor device according to the present embodiment. FIGS. 4A–4B are plan views of the semiconductor device according to the present embodiment and the conventional semiconductor device which show examples of parameters of the semiconductor device. FIGS. 5A–5D, 6A–6C, 7A–7C, and 8A–8C are sectional views of the semiconductor device according to the present embodiment in the steps of the method for fabricating the same, which explain the method.

First, the structure of the semiconductor device according to the present embodiment will be explained with reference to FIGS. 1, 2A–2C, 3, and 4A–4B. FIG. 2A is a sectional view along the line A–A' in FIG. 1. FIG. 2B is the sectional view along the line B–B' in FIG. 1. FIG. 2C is a sectional view along the line C–C' in FIG. 1.

An SOI substrate is formed of an insulation layer 12 of a silicon oxide film formed on a silicon substrate 10, and an SOI layer 14 of a single crystalline silicon layer formed on the insulation layer 12. A device isolation film 16 for defining a device region is formed in the SOI layer 14. A gate electrode 20 is formed on the device region interposing a gate insulation film 18 therebetween. A dummy electrode 22 is formed on the device region, spaced by a prescribed gap from the gate electrode 20. A sidewall insulation film 28 is formed on the side walls of the gate electrode 20 and the dummy electrode 22. The device region between the gate electrode 20 and the dummy electrode 22 is covered with the sidewall insulation film 28. An n-type dopant is incorporated in a source/drain ion implantation region 24 with the gate electrode 20 and the sidewall insulation film 28 as a mask to form source/drain regions 32 of an $n^+$-layer on the device region on both sides of the gate electrode 20. A body contact ion implantation region 34 indicated by the two-dot chain line in FIG. 1 is incorporated with a p-type dopant with the gate electrode 20, the dummy electrode 22 and the sidewall insulation film 38 as a mask to form a body contact region 36 of a $p^+$-layer. A titanium silicide film 38 is formed on that of the device region where the gate electrode 20, the dummy electrode 22 and the sidewall insulation film 28 are not formed.

As described above, the semiconductor device according to the present embodiment is characterized mainly in that the gate electrode 20 and the dummy electrode of a transistor are isolated from each other. The gate electrode 20 and the dummy electrode 22 are thus isolated from each other, whereby, as shown in FIG. 3, a parasitic capacitor formed by the dummy electrode 22 is isolated from the capacitor formed of the gate electrode 20 (MOSFET), and a gate capacitance can be decreased by that corresponding to an area of the dummy electrode 22. In FIG. 3, the switch mark is used to express that the dummy electrode 22 and the gate electrode 20 are isolated from each other.

As exemplified in FIG. 4, when an overlap of the gate electrode 20 and the dummy electrode 22 on the device isolation film 16 is 0.26 μm, an overlap of the dummy electrode 22 on the n-type ion implantation region is 0.26 μm, a width of the p-type ion implantation region is 0.40 μm, a gate width is 3.00 μm, a gate length is 0.16 μm, a width of the source/drain regions along the gate length is 0.30 μm, and a gap between the gate electrode 30 and the dummy electrode 22 is 0.18 μm, the conventional L-shaped structure (FIG. 4B) has a 0.7836 μm² gate area, and the semiconductor device according to the present embodiment (FIG. 4A) has a 0.5856 μm² gate area. The capacitor area of the semiconductor device according to the present embodiment can be decreased by about 25%. Considering that the silicon oxide film forming the gate insulation film is 3 nm, the gate capacitance can be decreased from 9.02 fF to 6.67 fF.

An inter-layer insulation film (not shown) is buried between the gate electrode 20 and the dummy electrode 22, whereby a parasitic capacitor is formed between the gate electrode 20 and the dummy electrode 22, and the capacitor formed by the gate electrode 20 and the capacitor formed by the dummy electrode 22 will be combined in capacitance. However, when it is assumed that the gate electrode 20 and the dummy electrode 22 have a 100 nm-thick, and a silicon oxide film is buried between the gate electrode 20 and the dummy electrode 22, a parasitic capacitance is about 0.018 fF, which is very small with respect to the gate capacitance. It is safe to think that the capacitor formed by the dummy electrode 22 and the capacitor formed by the gate electrode 20 are isolated from each other.

Next, the method for fabricating the semiconductor device according to the present embodiment will be explained with reference to FIGS. 5A–5D, 6A–6C, 7A–7C, and 8A–8C. FIGS. 5A–5D and 6A–6C are the sectional views of the semiconductor device along the line A–A' in FIG. 1, which is in the steps of the method for fabricating the semiconductor device. FIGS. 7A–7C and 8A–8C are sectional views of the semiconductor device along the line B–B' in FIG. 1, which is in the steps of the method for fabricating the same.

Figure 5A:
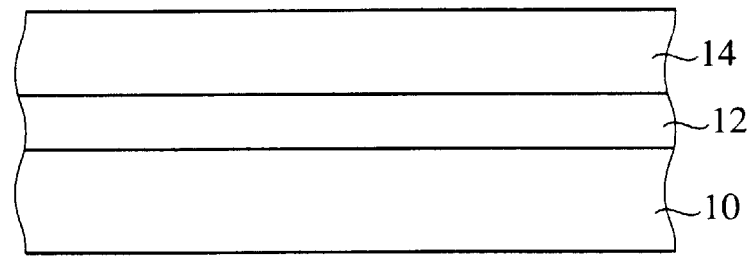
FIGS. 5A–5D, 6A–6C, 7A–7C, and 8A–8C are sectional views of the semiconductor device according to the first embodiment of the present invention in the steps of the method for fabricating the same, which show the method.
Figure 7A:
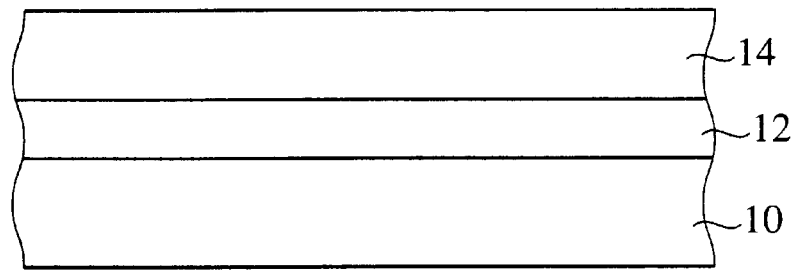

First, the SOI layer 14 of a single crystalline silicon layer is formed on a silicon substrate 10 interposing the insulation film of, e.g., a silicon oxide film therebetween to prepare an SOI substrate (FIG. 5A, FIG. 7A).

Figure 5B:
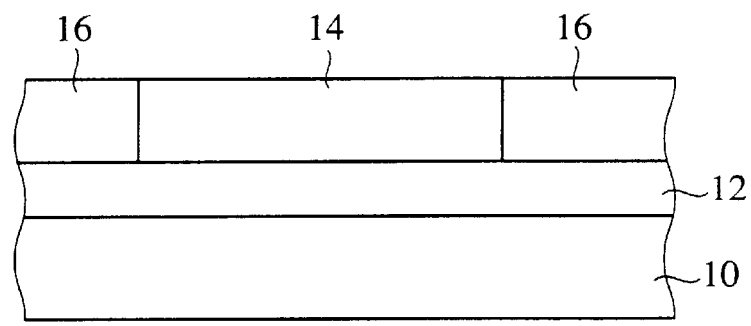
Figure 7B:
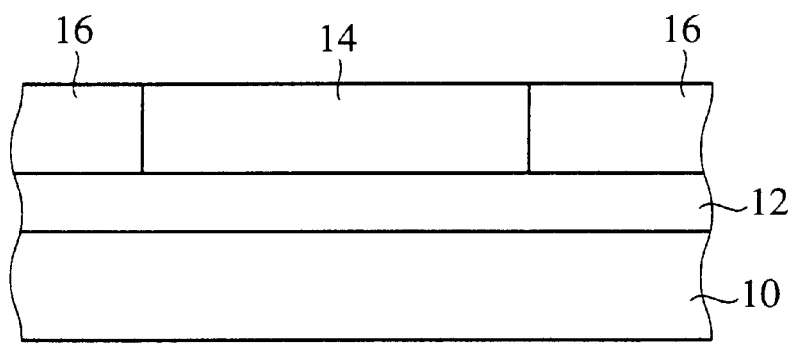

Next, a device isolation film is formed on the SOI layer of the SOI substrate down to the insulation layer by, e.g., shallow trench isolation technique (FIG. 5B, FIG. 7B). Thus, the device isolation film defines an device region.

Then, boron ions are implanted into the device region. This ion implantation is for implanting channel ions for controlling a threshold voltage of a MOSFET.

Next, the surface of the SOI layer 14 is thermally oxidized by, e.g., thermal oxidation to form the gate insulation film 18 of, e.g., a 3 nm-thick in the device region.

Then, a polycrystalline silicon film of, e.g., a 200 nm-thick is formed by, CVD method.

Figure 5C:
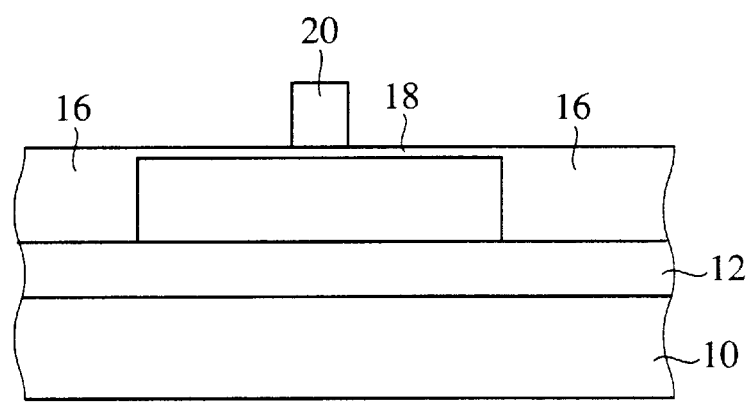
Figure 7C:
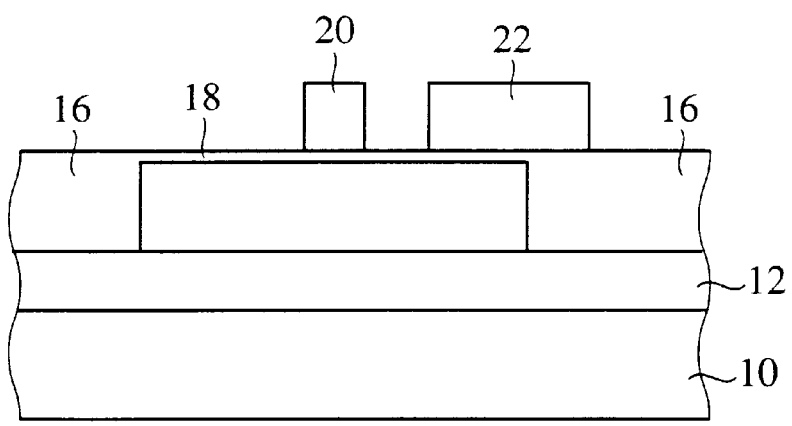

Next, the polycrystalline silicon film is patterned by the lithography and etching to form the gate electrode 20 and the dummy electrode 22 of the polycrystalline silicon film (FIG. 5C, FIG. 7C). At this time, the gate electrode 20 and the dummy electrode 22 are arranged with a gap which is, e.g., a minimum dimension for the gate processing so that the sidewall insulation film 28, which will be formed later, can cover the device region between the gate electrode 20 and the dummy electrode 22.

Figure 5D:
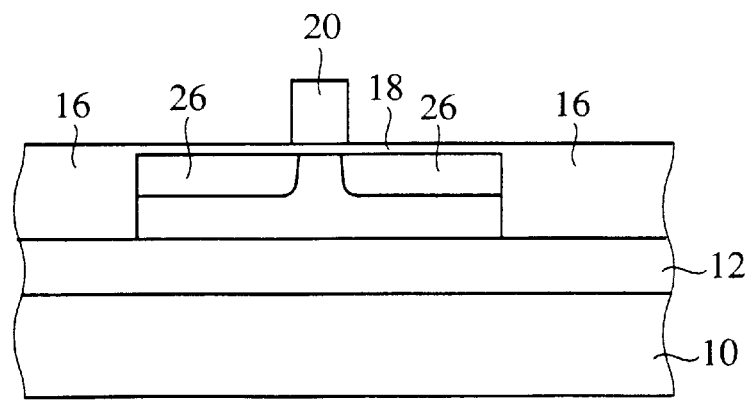

Next, with a photoresist film for exposing the source/drain ion implantation region (not shown) and the gate electrode 20 as a mask, arsenic ions are implanted to form a shallow dopant diffused region 26 of an extension source/drain structure (or a low-concentration dopant diffused region of the LDD structure) in the device region on both sides of the gate electrode 20 (FIG. 5D).

Then, a silicon oxide film of, e.g., a 200 nm-thick is deposited on the entire surface by, e.g., CVD method.

Figure 6A:
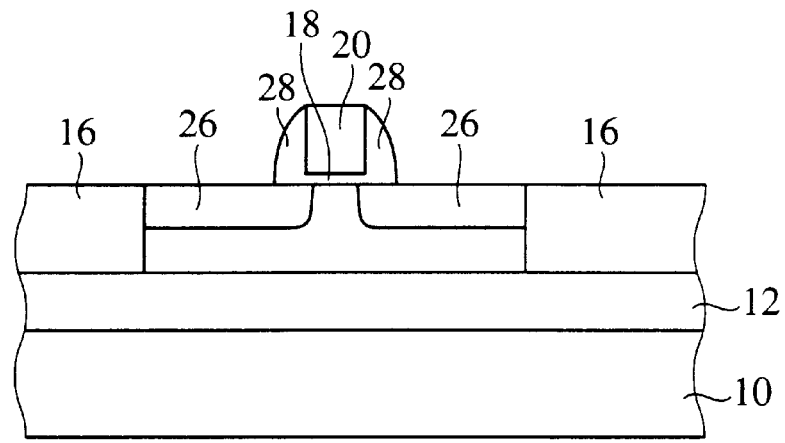
Figure 8A:
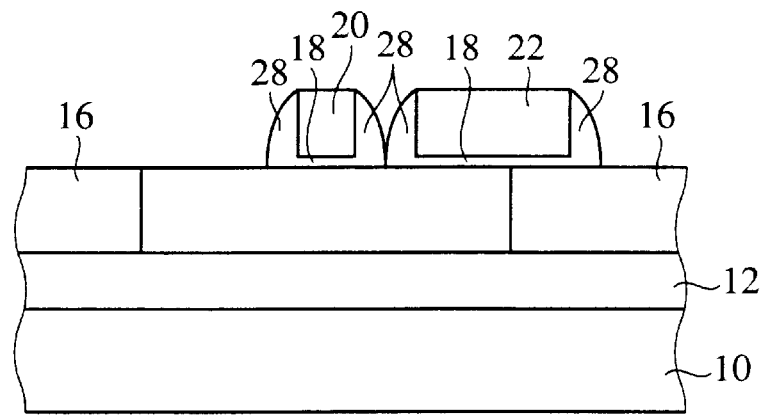

Next, the silicon oxide film is etched back to be left only on the side walls of the gate electrode 20 and the dummy electrode 22. Thus, the sidewall insulation film 28 of the silicon oxide film is formed on the side walls of the gate electrode 20 and the dummy electrode 22. At this time, the sidewall insulation film 28 formed on the side wall of the gate electrode 20 and on the side wall of the dummy electrode 22 contact in the region between the gate electrode 20 and the dummy electrode 22, and the SOI layer is not exposed on the surface (FIG. 6A, FIG. 8A).

Figure 6B:
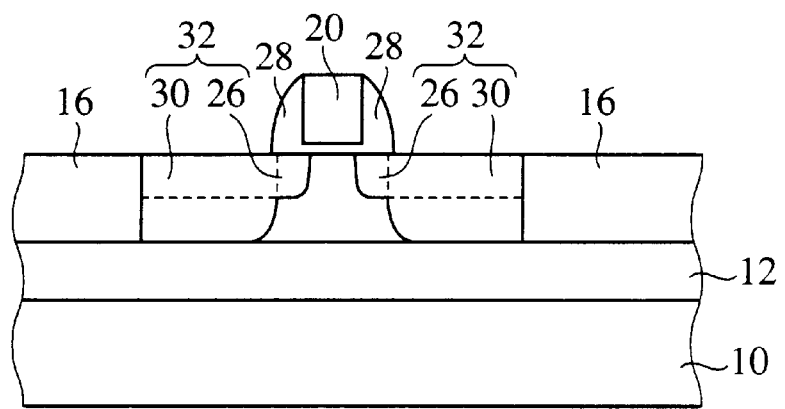

Then, arsenic ions, for example, are implanted with a photoresist film for exposing the source/drain ion implantation region (not shown), the gate electrode 20 and the sidewall insulation film 28 as a mask to form a deep dopant diffused region 30 of an extension source/drain structure (or a high-concentration dopant diffused region of the LDD structure) in the device region on both sides of the gate electrode 20. Thus, the source/drain regions 32 of an n+-layer of the dopant diffused region 26, 30 are formed (FIG. 6B).

Figure 8B:
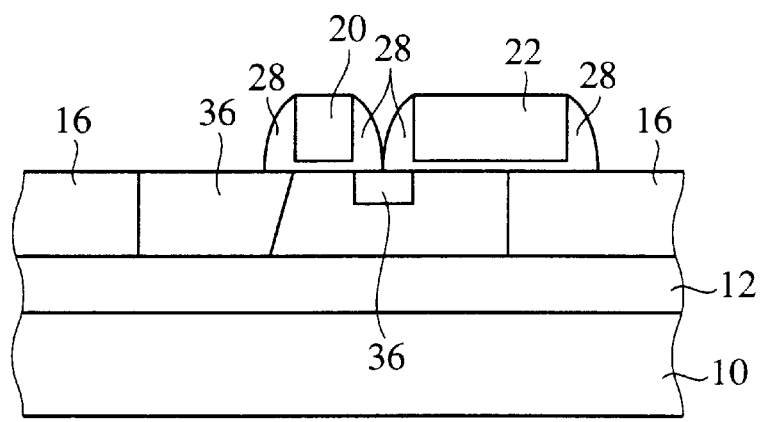

Then, boron ions, for example, are implanted with a photoresist film for exposing a body contact ion implantation region 34 (not shown), the gate electrode 20, the dummy electrode 22 and the sidewall insulation film 28 as a mask, to form the body contact region 36 of a p+-layer (FIG. 8B). Simultaneously therewith, the shallow body contact region 36 is formed in the device region between the gate electrode 20 and the dummy gate electrode 22, depending on a gap between the gate electrode 20 and the dummy electrode 22.

Figure 6C:
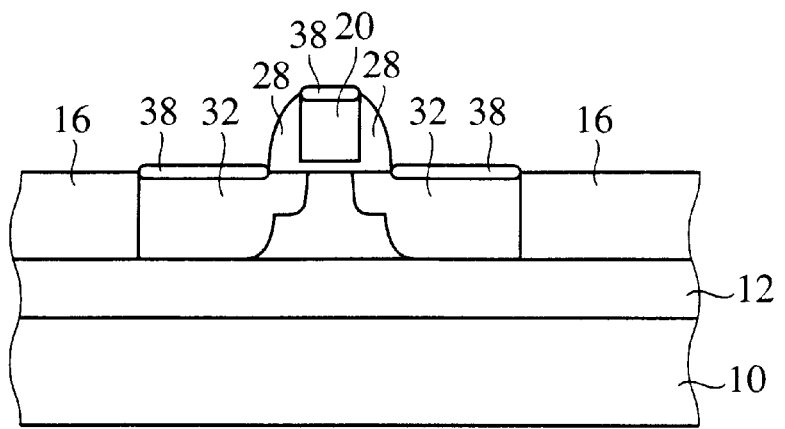
Figure 8C:
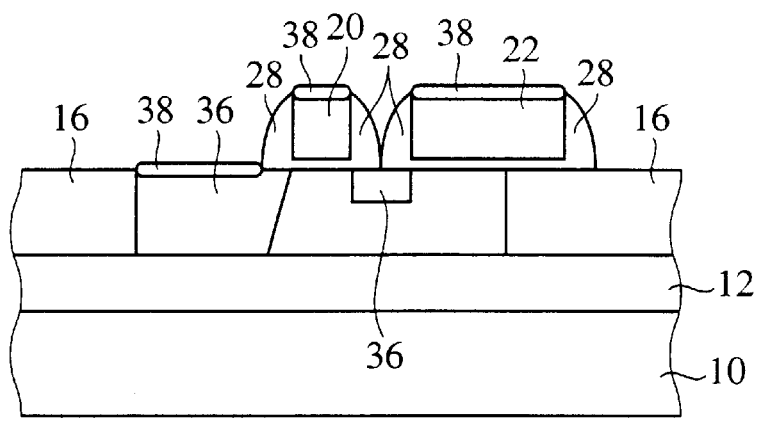

Then, the titanium silicide film 38 is formed by salicide process selectively on the gate electrode 20, the dummy electrode 22 and the exposed SOI layer 14 (FIG. 6C, FIG. 8C). The titanium silicide film 38 can be formed selectively on the gate electrode 20, the dummy electrode 22 and the SOI layer 14 by, e.g., depositing a titanium film on the entire surface, silicidizing by a rapid thermal processing the titanium film selectively on the gate electrode 20, the dummy electrode and the exposed SOI layer 14, and then removing the unreacted titanium film.

At this time, the titanium silicide film 38 is not formed in a gap between the gate electrode 20 and the dummy electrode 22, which is covered with the sidewall insulation film 28. Accordingly, the body contact region 36 and the source/drain regions 32 are never connected by the titanium silicide film 38, and never have the same potential.

As described above, according to the present embodiment, in the semiconductor device having the L-shaped structure, an electrode formed on a device region interposing the gate insulation film 18 therebetween is separated in the gate electrode 20 and in the dummy electrode 22, and the gate electrode 20 and the dummy electrode 22 are arranged without the silicide film formed therebetween, whereby the semiconductor device having body contacts can have a gate capacitance much decreased. Accordingly, speed performance deterioration of the transistors can be suppressed.

In the present embodiment, the region between the gate electrode 20 and the dummy electrode 22 is covered by the sidewall insulation film 28 but is not essentially covered completely by the sidewall insulation film 28. That is, when a region of the SOI layer 14, which is exposed between the gate electrode 2 and the dummy electrode 22 is so narrow as, e.g., 100 nm, in this region the silicidation does not take place. Accordingly, the body contact region 36 and the source/drain regions may be prevented from being connected to each other by setting a gap of the sidewall insulation film 28 between the gate electrode 20 and the dummy electrode 22 to be small for the silicidation not to take place in the gap. A width of the gap which dose not permit the silicidation to take place in the gap depends on a device structure and process parameters. Accordingly, it is preferable that a gap between the gate electrode 20 and the dummy electrode 22 is suitably selected in accordance with a device structure and process parameters.

In the present embodiment, the body region on the side of the drain region is substantially completely covered by the dummy electrode 22, but at least a vicinity of the border between the MOSFET formed region and the body contact region may be covered by the dummy electrode 22.

The dummy electrode 22 is not essentially formed in one solid pattern but may be formed in 2 or more patterns. For example, it is possible that the dummy electrode 22 is formed in plural pieces in the form of stripes, and gaps between the stripes are controlled to have a dimension which does not permit the silicide film to be formed in the gaps.

[A Second Embodiment]

The semiconductor device and the method for fabricating the same according to a second embodiment of the present invention will be explained with reference to FIG. 9. The same members of the present embodiment as those of the semiconductor device and the method for fabricating the same according to the first embodiment are represented by the same reference numbers not to repeat or to simplify their explanation.

Figure 9:
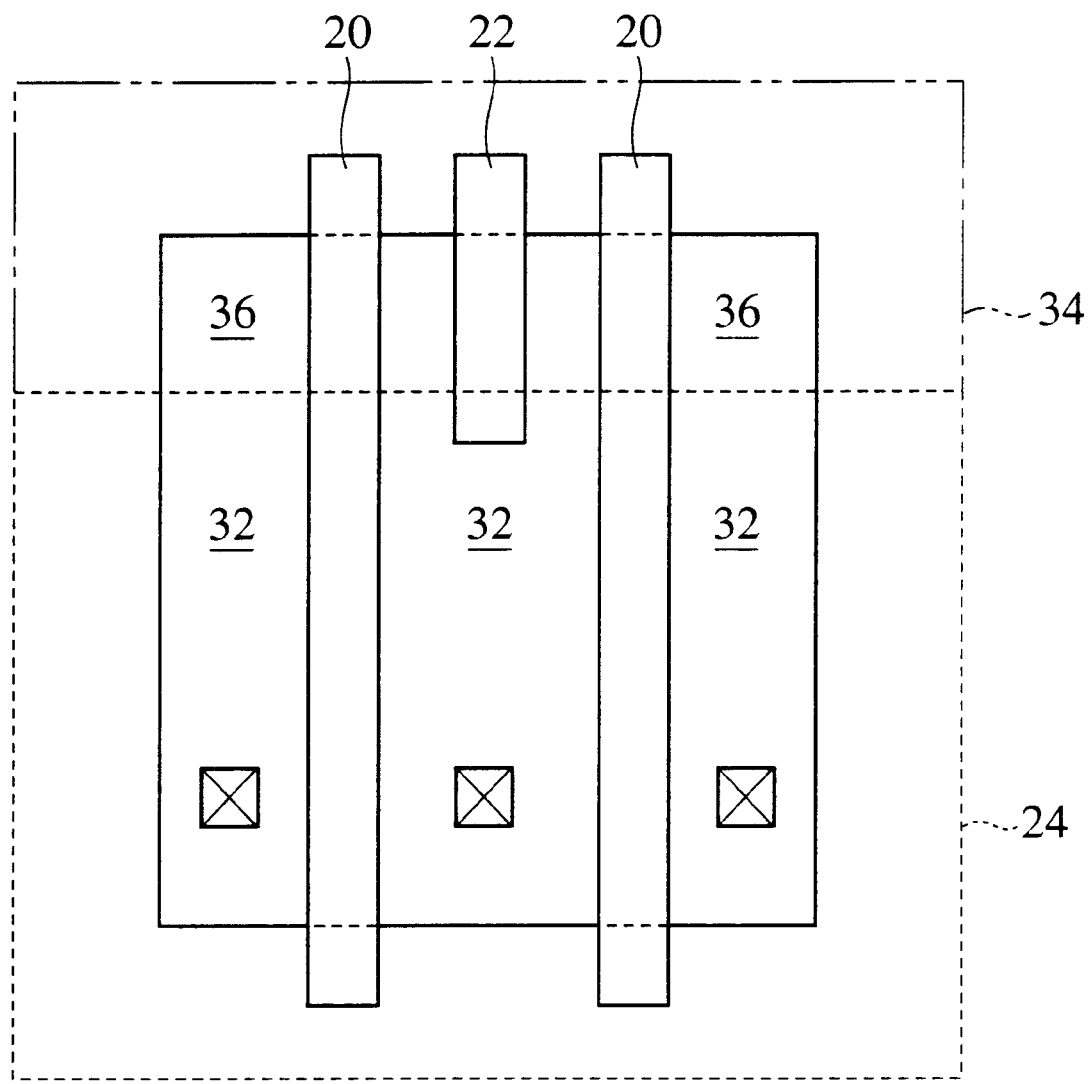
FIG. 9 is a plan view of the semiconductor device according to a second embodiment of the present invention, which shows a structure thereof.

FIG. 9 is a plan view of the semiconductor device according to the present embodiment, which shows a structure thereof.

The semiconductor device and the method for fabricating the same according to the present embodiment are basically the same as the semiconductor device and the method for fabricating the same according to the first embodiment of the present invention. The semiconductor device according to the present embodiment is characterized in that two transistors are formed with one drain region in common in one device region and with one dummy electrode in common. That is, two gate electrodes 20 are formed in parallel with each other on the device region. The dummy electrode 22 is formed, spaced from both gate electrodes 20 in a part of the region between the two gate electrodes 20. Gaps between the gate electrodes 20 and the dummy electrode 22 are set so as not to permit a silicide film to be formed in the gaps, as in the semiconductor device according to the first embodiment. The semiconductor device of such structure can have one dummy electrode 22 in common with the two transistors, which allows a device area to be much decreased.

As described above, according to the present embodiment, an electrode formed on a device region interposing a gate insulation film therebetween is separated in the gate electrodes 20 and the dummy electrode 22, and the gate electrodes 20 and the dummy electrode 22 are arranged at gaps which do not permit a silicide film to be formed between the dummy electrode 22 and the gate electrodes 20. Resultantly, the semiconductor device having body contacts can have a capacitance much decreased, whereby deterioration of speed performance of the transistors can be suppressed. Furthermore, two transistor have one dummy electrode in common, whereby a much decreased device area can be obtained.

The dummy electrode 22 is not essentially formed in one solid pattern but may be formed in 2 or more patterns. For example, it is possible that the dummy electrode 22 is formed in plural pieces in the form of stripes, and gaps between the stripes are controlled to have a dimension which does not permit the silicide film to be formed in the gaps.

[A Third Embodiment]

The semiconductor device and the method for fabricating the same according to a third embodiment of the present invention will be explained with reference to FIGS. 10A and 10B. The same members of the present embodiment as those of the semiconductor device and the method for fabricating the same according to the first and the second embodiments are represented by the same reference numbers not to repeat or to simplify their explanation.

Figure 10A:
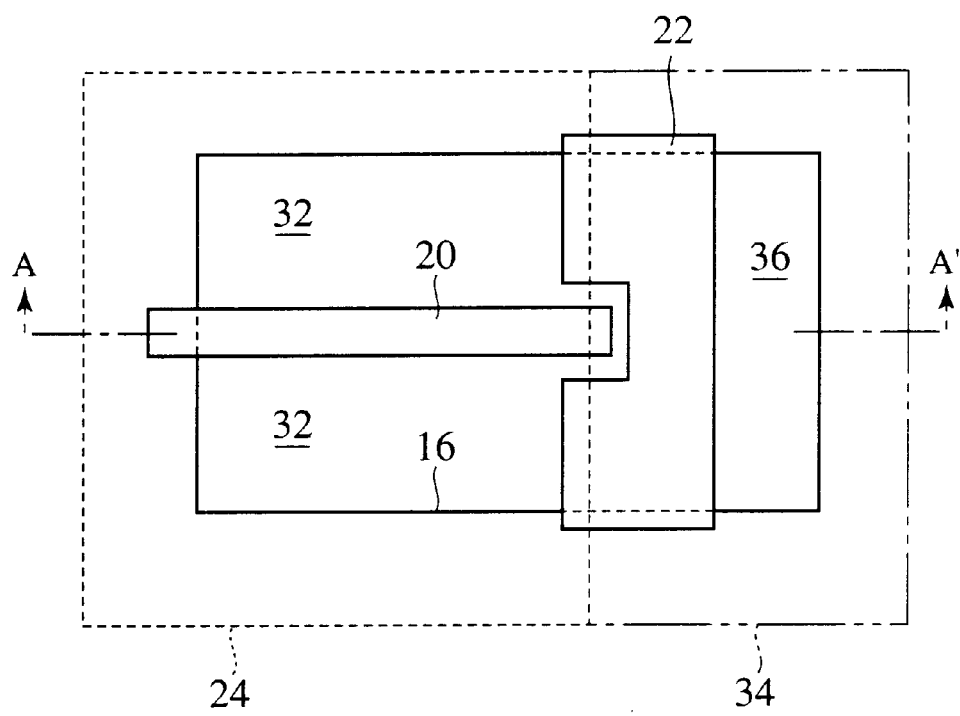
FIG. 10A is a plan view of the semiconductor device according to a third embodiment of the present invention, which shows a structure thereof.
Figure 10B:
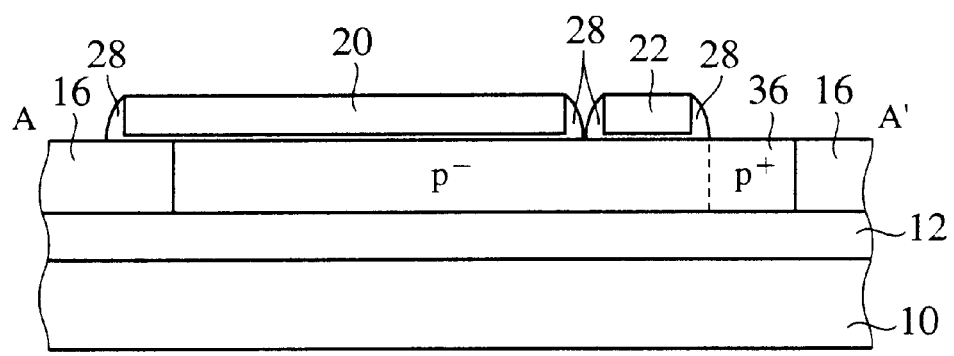
FIG. 10B is a diagrammatic sectional view of the semiconductor device according to the third embodiment of the present invention, which shows a structure thereof.

FIG. 10A is a plan view of the semiconductor device according to the present embodiment. FIG. 10B is a diagrammatic sectional view of the semiconductor device according to the present invention along the line A–A' in FIG. 10A.

The semiconductor device and the method for fabricating the same according to the present embodiment are the same as the semiconductor device and the method for fabricating the same according to the first embodiment except that a gate electrode 20 and a dummy electrode 22 have a positional relationship which is different from that of the first embodiment.

As shown in FIG. 10A, the semiconductor device according to the present embodiment is characterized in that the semiconductor device have the T-shaped structure in which the dummy electrode 22 for isolating source/drain regions 32 from a body contact region is spaced from the gate electrode 20. That is, the gate electrode 20, and the dummy electrode 22 for isolating the source/drain regions 32 from the body contact region 36 are formed on a device region. A gap between the gate electrode 20 and the dummy electrode 22 is set so as not to permit a silicide film to be formed in the gap, as in the semiconductor device according to the first embodiment. The semiconductor device has this structure, whereby a capacitor formed by the dummy electrode 22 and a capacitor formed by the gate electrode 20 (MOSFET) can be isolated from each other. Accordingly, deterioration of speed performance of the transistors can be suppressed.

As described above, according to the present embodiment, the semiconductor device has the T-shaped structure in which an electrode formed on a device region interposing a gate insulation film therebetween is separated in the gate electrode 20 and the dummy electrode 22, and a gap between the gate electrode 20 and the dummy electrode 22 is set so as not to permit a silicide film to be formed in the gap, whereby the semiconductor device having body contacts can have a capacitance much decreased. Accordingly, deterioration of speed performance of the transistors can be suppressed.

The dummy electrode 22 is not essentially formed in one solid pattern but may be formed in 2 or more patterns. For example, it is possible that the dummy electrode 22 is formed in plural pieces in the form of stripes, and gaps between the stripes are controlled to have a dimension which does not permit the silicide film to be formed in the gaps.

[A Fourth Embodiment]

The semiconductor device and the method for fabricating the same according to a fourth embodiment of the present invention will be explained with reference to FIG. 11. The same members of the present embodiment as those of the semiconductor device and the method for fabricating the same according to the first to the third embodiments are represented by the same reference numbers not to repeat or to simplify their explanation.

Figure 11:
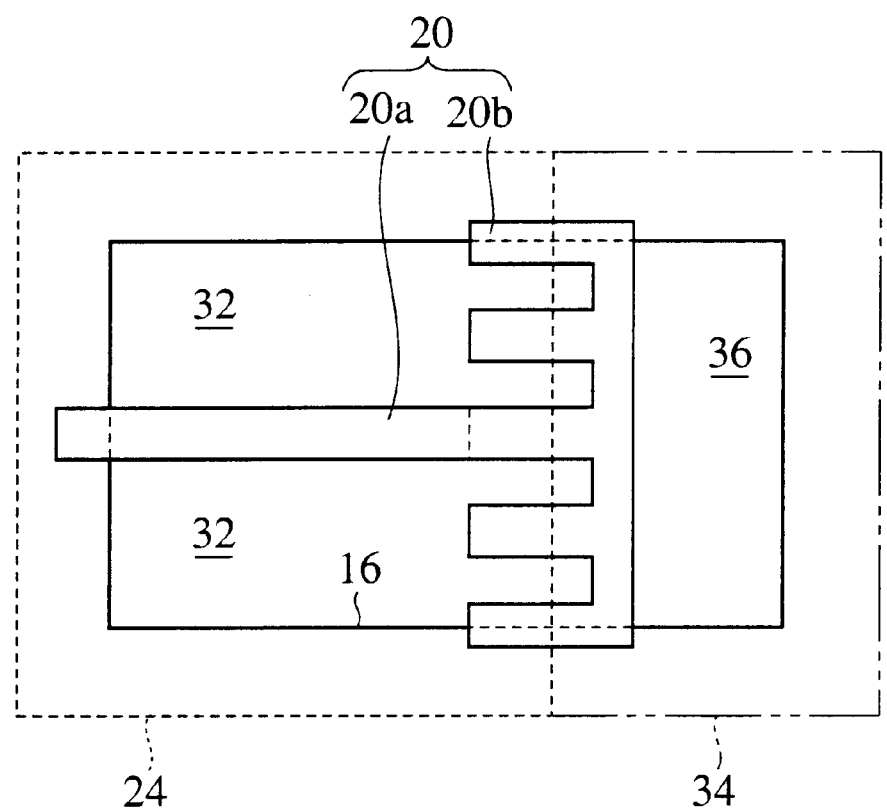
FIG. 11 is a plan view of the semiconductor device according to a fourth embodiment of the present invention, which shows a structure thereof.

FIG. 11 is a plan view of the semiconductor device according to the present embodiment, which shows the structure thereof.

First, a structure of the semiconductor device according to the present embodiment will be explained with reference to FIG. 11.

An SOI substrate is formed of an insulation layer 12 of a silicon oxide film formed on a silicon substrate 10, and an SOI layer 14 of a single crystalline silicon layer formed on the insulation layer 12. A device isolation film 16 for defining a device region is formed in the SOI layer 14. A gate electrode 20 is formed on the device region interposing a gate insulation film 18 therebetween. The gate electrode 20 has a substantially T-shaped pattern and arranged, dividing the device region in 3 regions. In the following description, a region of the longitudinal bar of the T-shape of the gate electrode 20 is often called the gate electrode 20a, and a region of the lateral bar of the T-shape of the gate electrode 20 is often called the dummy electrode 20b. A sidewall insulation film 28 is formed on the side wall of the gate electrode 20. Source/drain regions 32 of an n$^+$-layer are formed in the device region on both sides of the gate electrode 20a. A body contact region 36 of a p$^+$-layer is formed in the device region on the side of the dummy electrode 20b where the source/drain regions 32 are not formed. A silicide film 38 is formed on the device region where the gate electrode 20a, the dummy electrode 20b and the sidewall insulation film 28 are not formed.

As described above, the semiconductor device according to the present embodiment is basically has the T-shaped structure. A major characteristic of the semiconductor device according to the present embodiment is that the dummy electrode 20b isolating the source/drain regions 32 and the body contact region 36 from each other is patterned in comb-shaped. A gap between the comb where the dummy electrode 20 is absent is set so as not to allow a silicide film to be formed in the gaps, as is the gap between the gate electrode 20 and the dummy electrode 22 of the semiconductor device according to the first to the third embodiments. The semiconductor device having such structure can have an area of the dummy electrode much decreased, whereby deterioration of speed performance of the transistors can be suppressed.

Here, when it is assumed that the semiconductor device has a 0.25 µm-gate length, a 5 µm-gate width, a 0.5 µm-width of the dummy electrode 20b, a 1.5 µm-length of the body contact region 36, and a 5 nm-thick of the gate insulation film 18, the gate electrode 20a has a 1.25 µm area. The conventional semiconductor device having the dummy electrode which is not formed in comb-shaped has a 0.75 µm area of the dummy electrode. A charged capacitance increase by the dummy electrode is about 60%. In the semiconductor device according to the present embodiment having the comb-shaped dummy electrode, when an area of the comb-shaped dummy electrode is, e.g., ¾ of the above-described area, a charged capacitance increase by the dummy electrode 20 is 45%, and 10% improvement of the performance can be made.

The method for fabricating the semiconductor device according to the present embodiment is the same as the method for fabricating the semiconductor device according to the first embodiment except the plane layout of the respective layers.

As described above, according to the present embodiment, the dummy electrode can have an area decreased, whereby the semiconductor device having the body contacts can have a capacitance much decreased. Accordingly, deterioration of speed performance of the transistors can be suppressed.

In the present embodiment, the source/drain regions 32 are positioned on the side where the comb of the dummy electrode 20 are opened. However, the body contact region 36 may be on the side where the comb of the dummy electrode 20 are opened, but in this case, a parasitic capacitance is more increased by the junction capacitance than in the case that the source/drain regions 32 are positioned on the side where the comb of the dummy electrode 20 are opened. From the viewpoint of the parasitic capacitance, it is preferable that preference is made to decreasing an area of the dummy electrode 20b on the side of the source/drain region 32 than on the side of the body contact region 36.

Figure 12:
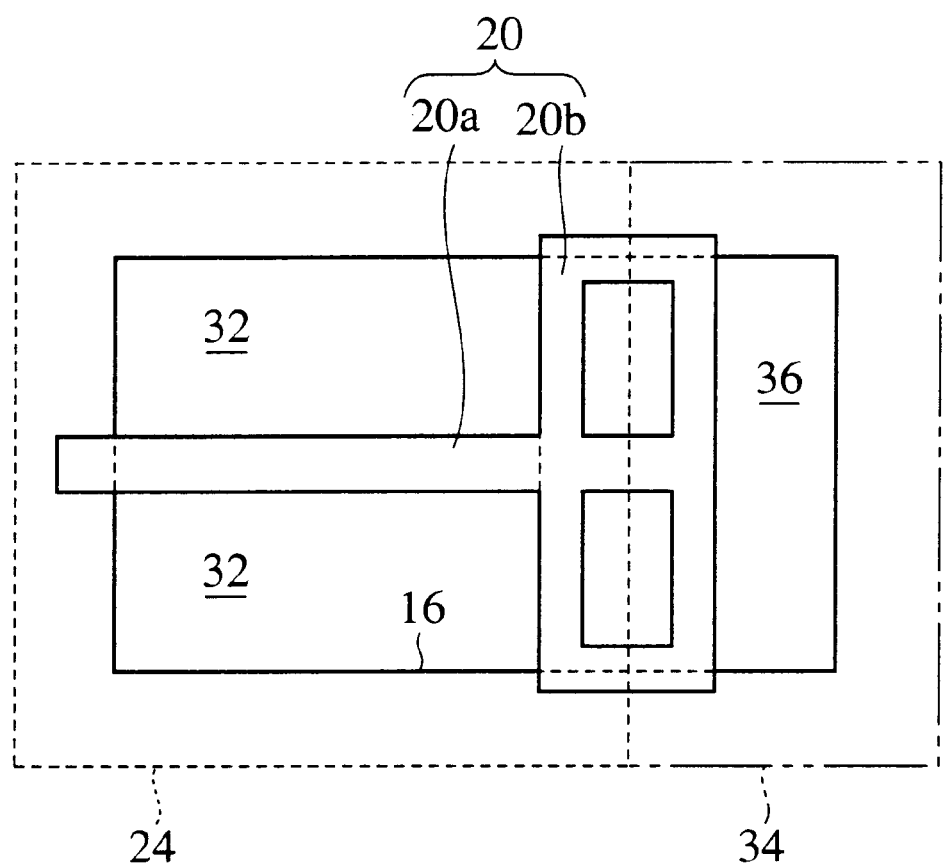
FIG. 12 is a plan view of the semiconductor device according to one modification of the fourth embodiment of the present invention, which shows a structure thereof.

In the present embodiment, the dummy electrode 20b is formed in comb-shaped so as to make an area of the dummy electrode 20b small. However, it is not essential to form the dummy electrode 20b in comb-shaped. As exemplified in FIG. 12, the dummy electrode 20b may have open spaces inside so as to have a smaller area. In this case, it is preferable from the viewpoint of the parasitic capacitance that the sidewall insulation film 28 is buried in the open spaces so that a silicide film 38 cannot be formed in the open spaces. However, the body contact region 36 and the source/drain regions 32 are not shorted with each other by the silicide film 38 in the open spaces, if the silicide film is formed in the open spaces. Accordingly, it is not necessary that the open spaces have a width which does not permit the silicide film 38 to be formed in the open spaces.

Figure 30A:
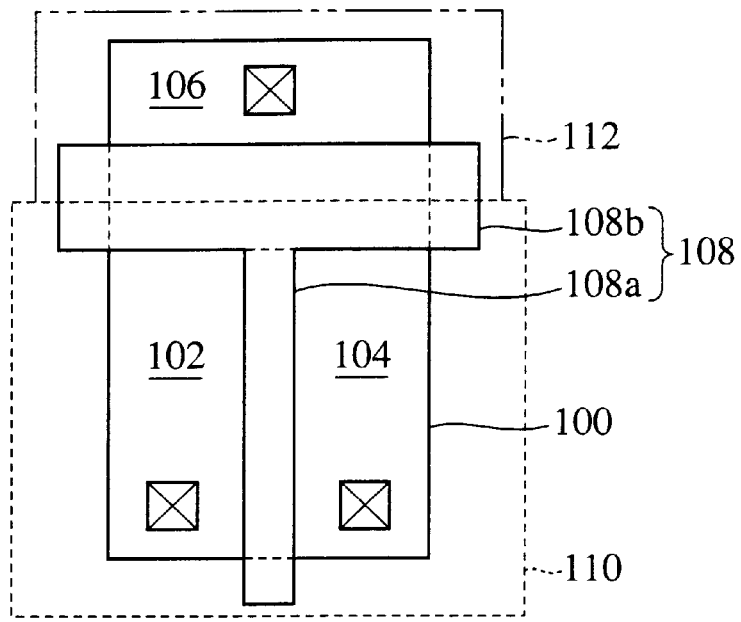
FIGS. 30A and 30B are plan views of the conventional semiconductor device, which show the structures thereof.
Figure 30B:
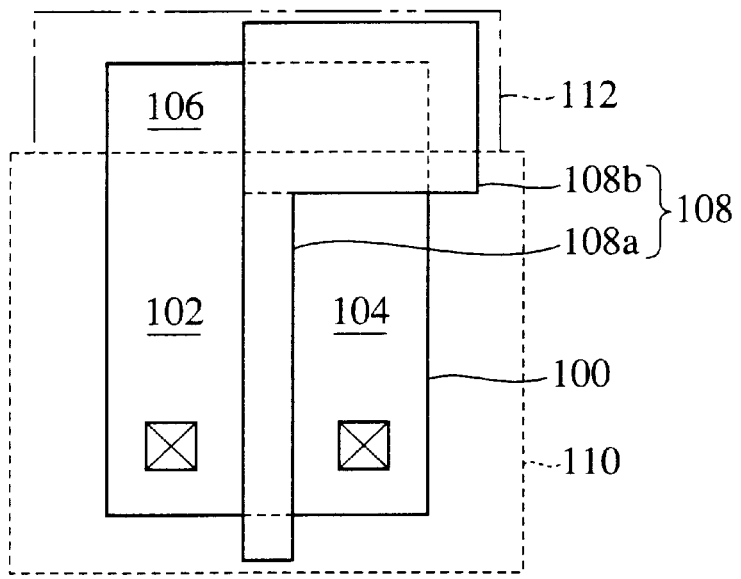
Figure 31:
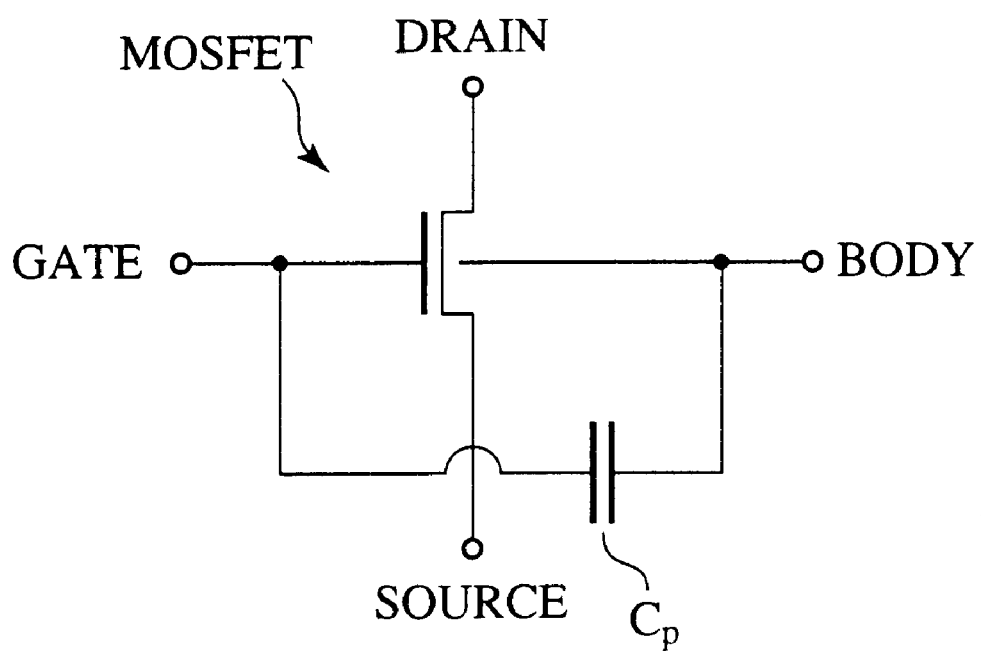
FIG. 31 is a circuit diagram of an equivalent circuit of the conventional semiconductor device.

In the present embodiment, the dummy electrode of the semiconductor device of the T-shape shown in FIG. 30A is formed in comb-shaped, but the dummy electrode of the semiconductor device of the L-shape shown in FIG. 30B may be formed in comb-shaped. The gate electrode and the dummy electrode may be isolated in the same way as in the first to the third embodiments.

[A Fifth Embodiment]

The semiconductor device and the method for fabricating the same according to a fifth embodiment of the present invention will be explained with reference to FIGS. 13A–13B and 14A–14D. The same members of the present embodiment as those of the semiconductor device and the method for fabricating the same according to the first to the fourth embodiments are represented by the same reference numbers not to repeat or to simplify their explanation.

Figure 13A:
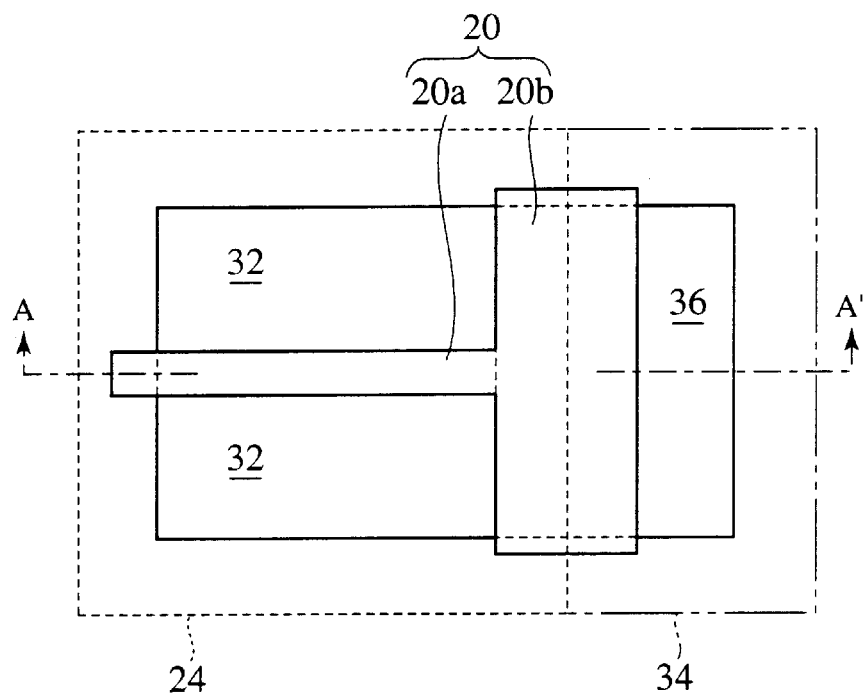
FIG. 13A is a plan view of the semiconductor device according to a fifth embodiment of the present invention, which show a structure thereof.
Figure 13B:
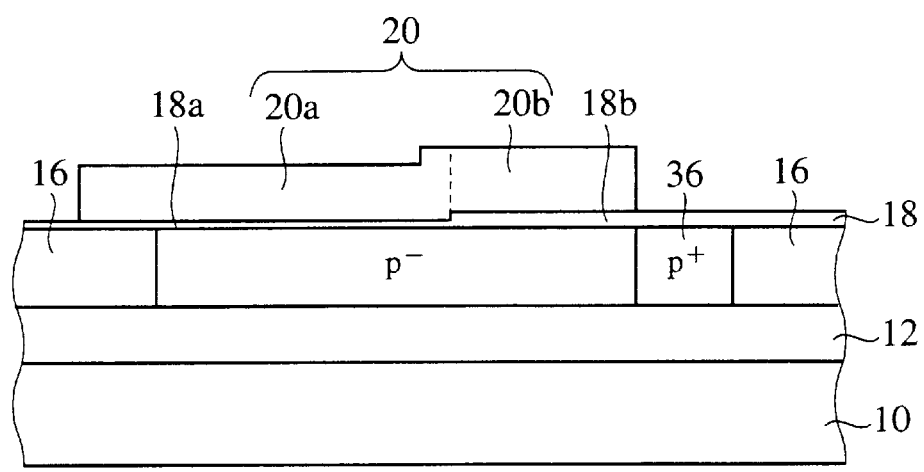
FIG. 13B is a diagrammatic sectional view of the semiconductor device according to the fifth embodiment of the present invention, which show a structure thereof.

FIG. 13A is a plan view of the semiconductor device according to the present embodiment, which show the structure thereof. FIG. 13B is a diagrammatic sectional view of the semiconductor device according to the present embodiment, which show the structure thereof. FIGS. 14A–14D are sectional views of the semiconductor device according to the present embodiment in the steps of the method for fabricating the same, which show the method.

First, the structure of the semiconductor device according to the present embodiment will be explained with reference to FIGS. 13A and 13B. FIG. 13B is the sectional view along the line A–A' in FIG. 13A.

An SOI substrate is formed of an insulation layer 12 of a silicon oxide film formed on a silicon substrate 10, and an SOI layer 14 of a single crystalline silicon layer formed on the insulation layer 12. A device isolation film 16 for defining a device region is formed in the SOI layer 14. A gate electrode 20 is formed on the device region interposing a gate insulation film 18 therebetween. The gate electrode 20 has a T-shaped pattern and is arranged, dividing the device region in three regions. In the following description, only a region of the longitudinal part of the T-shape of the gate electrode 20 is often called the gate electrode 20a, and only a region of the lateral part of the T-shape of the gate electrode 20 is often called the dummy electrode 20b. A gate insulation film 18 below the gate electrode 20a is called the gate insulation film 18a, and the gate insulation film 18 below the dummy electrode 20b is called the gate insulation film 18b. A sidewall insulation film 28 is formed on the side wall of the gate electrode 20. Source/drain regions 32 of an n$^+$-layer is formed in the device region on both sides of the gate electrode 20a. A body contact region 36 of a p$^+$-layer is formed in the device region on the side of the dummy electrode 20b where the source/drain regions 32 are not formed. A silicide film 38 is formed on the device region except the regions the gate electrode 20a, the dummy electrode 20b and the sidewall insulation film 28 are formed.

As described above, the semiconductor device according to the present embodiment basically has the T-shaped structure of the semiconductor device shown in FIG. 30A. The semiconductor device according to the present embodiment is characterized in that a capacitance per a unit area of a capacitor formed by the dummy electrode 20b is smaller than a capacitance per the unit area of a capacitor formed by the gate electrode 20a. The semiconductor device having such structure can decrease a capacitance of the capacitor formed by the dummy electrode 20b, and deterioration of speed performance of the transistors can be accordingly suppressed.

As means for making a capacitance per a unit area of a capacitor formed by the dummy electrode 20b smaller than a capacitance per the unit area of a capacitor formed by the gate electrode 20a, what are proposed are to make the insulation film below the dummy electrode 20b selectively thicker, to make a dielectric constant of the gate insulation film 18b below the dummy electrode 20b selectively lower, or other means.

Next, the method for fabricating the semiconductor device according to the present embodiment will be explained with reference to FIGS. 14A–14D.

Figure 14A:
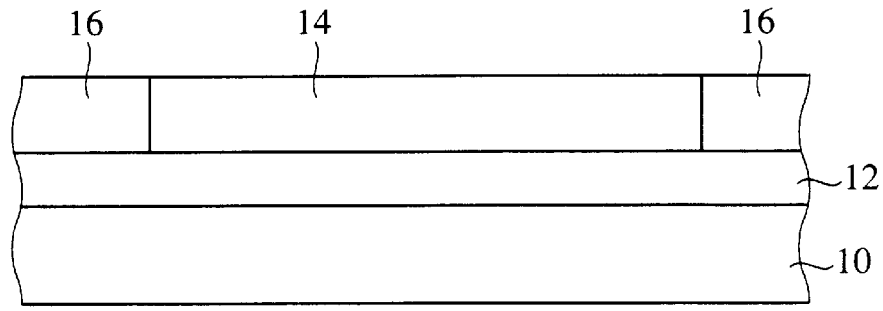
FIGS. 14A–14D are sectional views of the semiconductor device according to the fifth embodiment of the present invention in the steps of the method for fabricating the semiconductor device, which show the method.

First, a device isolation film 16 is formed down to the insulation film 12 in the SOI layer 14 of an SOI substrate by, e.g., shallow trench isolation technique (FIG. 14A). Thus, a device region is defined by the device isolation film 16.

Next, the SOI layer 14 is thermally oxidized by, e.g., thermal oxidation to form a silicon oxide film 40 of, e.g., a 9 nm-thick.

Figure 14B:
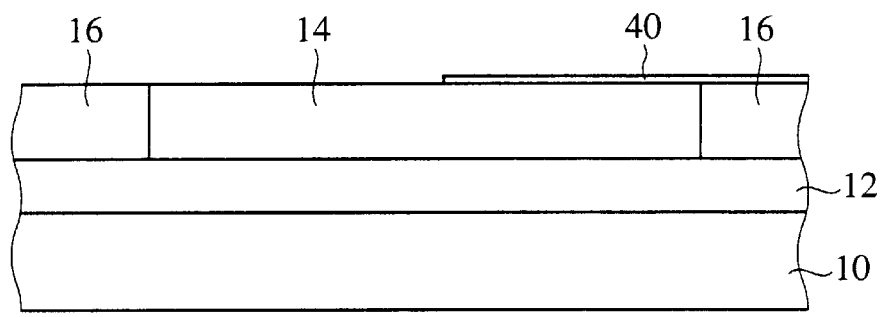

Then, the silicon oxide film 40 in a region where the gate electrode 20a to be formed is selectively removed by the lithography and etching (FIG. 14B).

Then, a silicon oxide film of, e.g., a 3 nm-thick is formed by, e.g., thermal oxidation.

Next, a silicon nitride film 44 is formed on the silicon oxide film 42 by, e.g., CVD method.

Figure 14C:
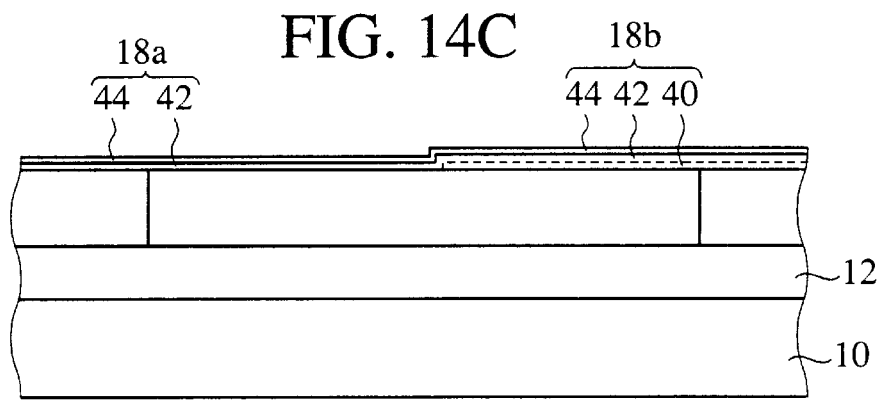

Thus, the gate insulation film 18a of the silicon oxide film 42 and the silicon nitride film 44 is formed in the region where the gate electrode 20a is to be formed, and the gate insulation film 18b formed of the silicon oxide films 40, 42 and the silicon nitride film 44 is formed in the region where the dummy electrode 20b is to be formed (FIG. 14C).

Next, a polycrystalline silicon film of, e.g., a 200 nm-thick is formed by, e.g., CVD method.

Figure 14D:
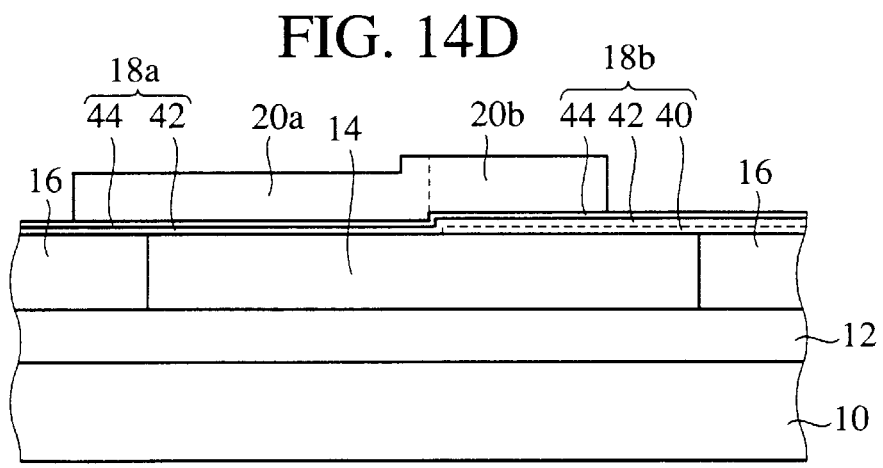

Next, the polycrystalline silicon film is patterned by the lithography and etching to form the gate electrode 20a and the dummy electrode 20b (FIG. 14D).

Next, the source/drain regions 32 and the body contact region 36, etc. are formed in the same way as in, e.g., the method for fabricating the semiconductor device according to the first embodiment shown in FIGS. 5D to 6C and FIGS. 8A to 8C.

As described above, according to the present embodiment, a capacitance per a unit area of a capacitor formed below the dummy electrode 20b is smaller than a capacitance per the unit area of a capacitor formed below the gate electrode 20a, whereby a gate capacitance can be small, and accordingly deterioration of speed performance of the transistor can be suppressed.

In the present embodiment, the gate insulation film 18a below the gate electrode 20a is formed of the silicon oxide film 42 and the silicon nitride film 44, and the gate insulation film 18b below the dummy electrode 20b is formed of the silicon oxide films 40, 42 and the silicon nitride film 44, but materials forming the gate insulation film 18 are not limited to these materials. Materials may be suitably selected so that a capacitance per a unit area of a capacitor formed below the dummy gate 20b is smaller than a capacitance per the unit area of a capacitor formed below the gate electrode 20a.

Semiconductor devices having high breakdown voltage transistors can have the advantageous effect of the present embodiment without adding to a number of fabrication steps by forming the gate insulation film for the high breakdown voltage transistors below the dummy electrodes.

The semiconductor device according to the present embodiment has the T-shaped structure but may have the L-shaped structure. The gate electrode and the dummy electrode may be isolated from each other in the same manners as in the first to the third embodiments.

[A Sixth Embodiment]

The semiconductor device and the method for fabricating the same according to a sixth embodiment of the present invention will be explained with reference to FIGS. 15A–15B, 16, and 17A–17D. The same members of the present embodiment as those of the semiconductor device and the method for fabricating the same according to the first to the fifth embodiments are represented by the same reference numbers not to repeat or to simplify their explanation.

Figure 15A:
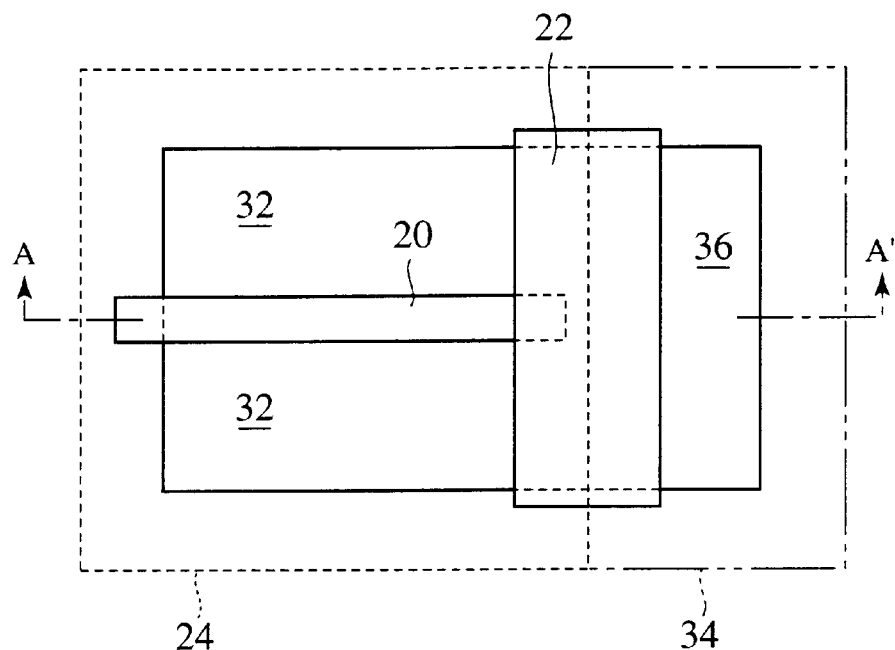
FIG. 15A is a plan view of the semiconductor device according to a sixth embodiment of the present invention, which shows a structure thereof.
Figure 15B:
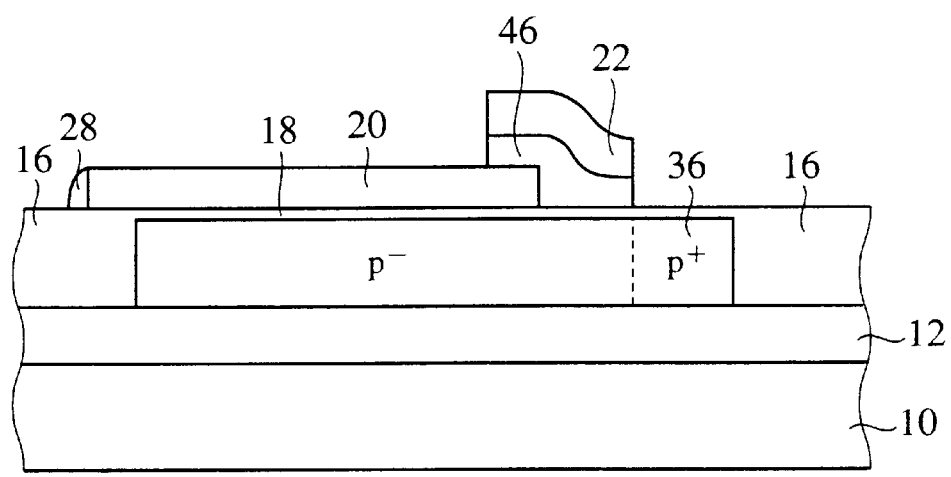
FIG. 15B is a diagrammatic sectional view of the semiconductor device according to the sixth embodiment of the present invention, which shows a structure thereof.
Figure 16:
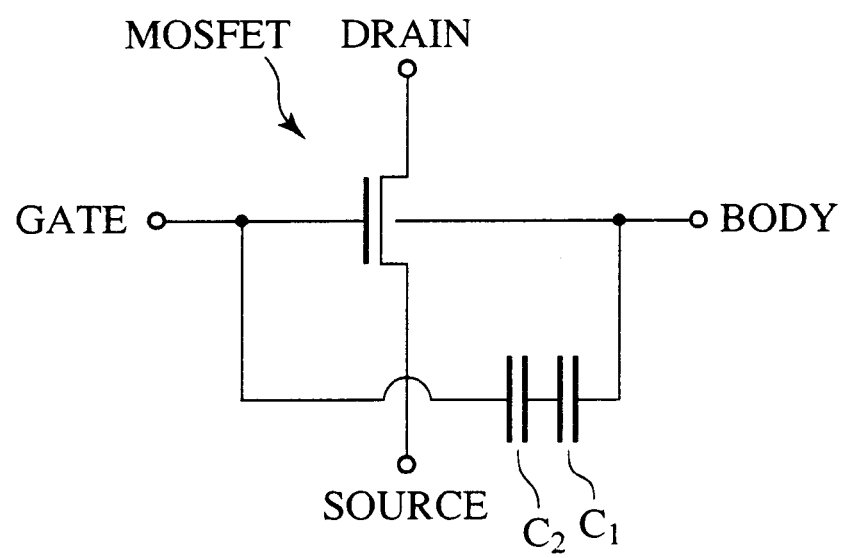
FIG. 16 is a circuit diagram of an equivalent circuit of the semiconductor device according to the sixth embodiment of the present invention.

FIG. 15A is a plan view of the semiconductor device according to the present embodiment, which shows the structure thereof. FIG. 15B is a diagrammatic sectional view of the semiconductor device according to the present embodiment, which shows the structure thereof. FIG. 16 is a circuit diagram of an equivalent circuit of the semiconductor device according to the present embodiment. FIGS. 17A–17D are sectional views of the semiconductor device in the steps of the method for fabricating the semiconductor device, which show the method.

First, the structure of the semiconductor device according to the present embodiment will be explained with reference to FIGS. 15A–15B and 16. FIG. 15B is the sectional view along the line A–A' in FIG. 15A.

An SOI substrate is formed of an insulation film 12 of a silicon oxide film formed on a silicon substrate 10, and an SOI layer 14 of a single crystalline silicon layer formed on the insulation layer 12. A device isolation film 16 for defining a device region is formed in the SOI layer 14. A gate electrode 20 is formed on the device region interposing a gate insulation film 18 therebetween. An insulation film 46 is formed on the gate electrode 20. A dummy electrode 22 is formed on the insulation film 46 with a part thereof extended over the gate electrode 20. Source/drain regions 32 of an $n^+$-layer are formed in the device region on both sides of the gate electrode 20. A body contact region 36 of a $p^+$-layer is formed in the device region on the side of the dummy electrode 22 where the source/drain regions 32 are not formed. A silicide film 38 is formed on the device region where the gate electrode 20, the dummy electrode 22 and the sidewall insulation film 28 are not formed.

As described above, the semiconductor device according to the present embodiment is the same in plane as the semiconductor device having the T-shaped structure but is characterized mainly in that the gate electrode 20 and the dummy electrode 22 are formed of different conductive layers and are not electrically connected to each other. In the semiconductor device of such structure, as shown in FIG. 16, a capacitor serially connected with a capacitor $C_1$ formed by the dummy electrode 22 and a capacitor $C_2$ formed between the gate electrode 20 and the dummy electrode 22 interposing the insulation film 46 therebetween is parallelly connected with a capacitor formed by the gate electrode 20 (MOSFET). Accordingly, a capacitance of the capacitor parallelly connected with the capacitor formed by the gate electrode 20 can be made smaller in comparison with that of the capacitor $C_1$ formed by the dummy electrode 22. The dielectric film of the capacitor $C_1$ formed by the dummy electrode 22 is thicker by a thickness of the insulation film 46, whereby a capacitance thereof can be made smaller.

Then, the method for fabricating the semiconductor device according to the present embodiment will be explained with reference to FIGS. 17A–17D. FIGS. 17A–17D are the sectional views of the semiconductor device along the line A–A' in FIG. 15A in the steps of the method for fabricating the semiconductor device, which show the method.

Figure 17A:
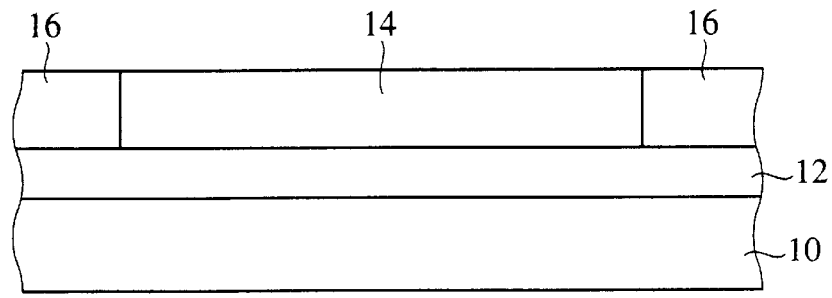
FIGS. 17A–17D are sectional views of the semiconductor device according to the sixth embodiment of the present invention in the steps of the method for fabricating the same, which show the method.

First, the device isolation film 16 is formed down to the insulation layer in the SOI layer 14 of an SOI substrate by, e.g., shallow trench isolation technique (FIG. 17A).

Next, the surface of the SOI layer 14 is thermally oxidized by, e.g., thermal oxidation to form the gate insulation film 18 of, e.g., a 3 nm-thick on the device region.

Figure 17B:
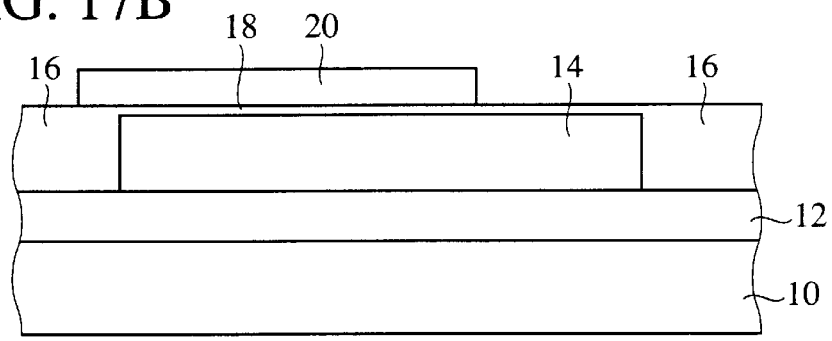

Then, a polycrystalline silicon film of, e.g., a 200 nm-thick is deposited by, e.g., CVD method and is patterned by the lithography and etching to form the gate electrode 20 of the polycrystalline silicon film (FIG. 17B).

Then, with a photoresist (not shown) for exposing a source/drain ion implantation region 24 and the gate electrode 20 as a mask, arsenic ions, for example, are implanted to form a shallow dopant diffused region (not shown) of an extension source/drain structure in the device region on both sides of the gate electrode 20.

Next, a silicon oxide film of, e.g., a 150 nm-thick is deposited on the entire surface by, e.g., CVD method to form the insulation film 46 of the silicon oxide film.

Figure 17C:
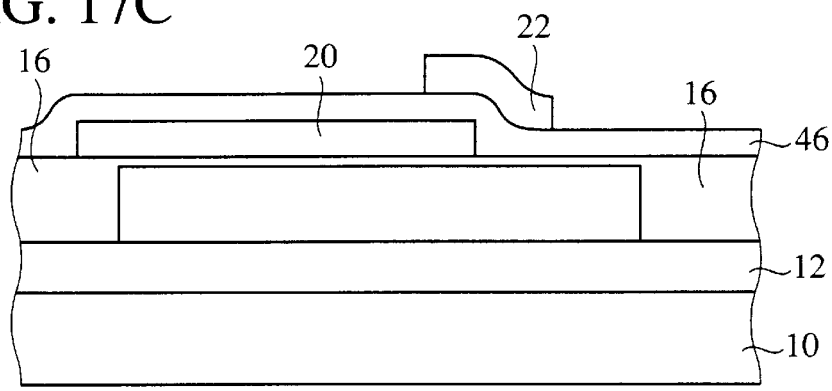

Then, a polycrystalline silicon film of, e.g., a 200 nm-thick is deposited by, e.g., CVD method and is patterned by the lithograph and etching to form the dummy electrode 22 of the polycrystalline silicon film (FIG. 17C).

Figure 17D:
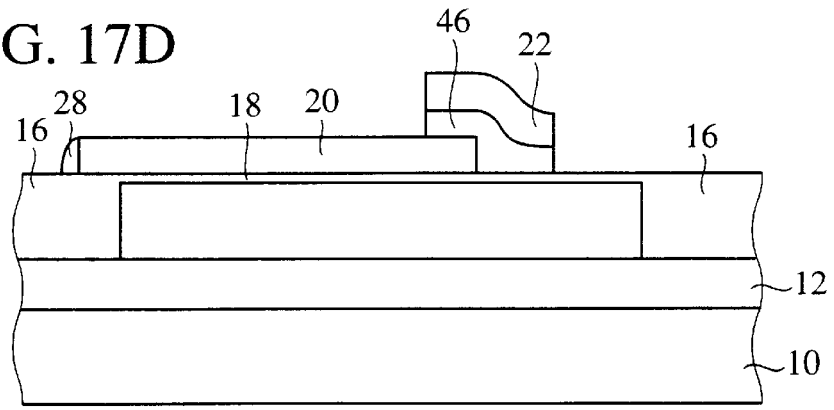

Then, with the dummy electrode 22 as a mask, the insulation film 46 is etched back to be left only below the dummy electrode 22 and only on the side wall of the gate electrode 20. Thus, the sidewall insulation film 28 of the silicon oxide film forming the insulation film 46 is formed on the side wall of the gate electrode 20 (FIG. 17D).

Next, the source/drain regions 32, the body contact region 36, etc. are formed in the same way as in the method for fabricating the semiconductor device according to the first embodiment as exemplified in FIGS. 6B to 6C and FIGS. 8B to 8C.

As described above, according to the present embodiment, the gate electrode and the dummy electrode are formed of different conductive layers, and a capacitor formed by the gate electrode is parallelly connected to a capacitor formed by the dummy electrode via a capacitor between the gate electrode and the dummy electrode, whereby a gate capacitance can be small, and accordingly deterioration of speed performance of the transistor can be suppressed.

[A Seventh Embodiment]

The semiconductor device and the method for fabricating the same according to a seventh embodiment of the present invention will be explained with reference to FIGS. 18 and 19A–19D. The same members of the present embodiment as those of the semiconductor device and the method for fabricating the same according to the first to the sixth embodiments of the present invention are represented by the same reference numbers not to repeat or to simplify their explanation.

Figure 18:
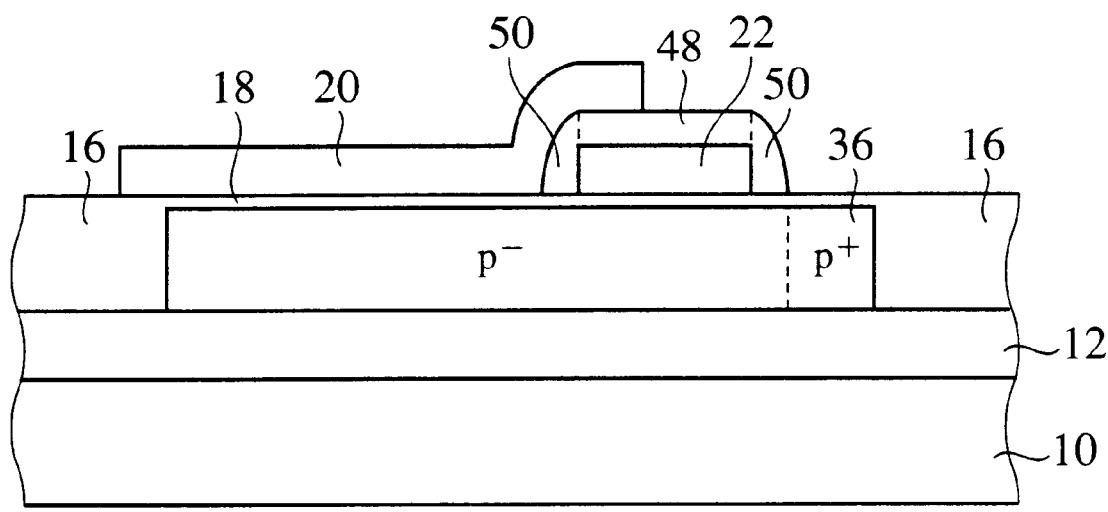
FIG. 18 is a diagrammatic sectional view of the semiconductor device according to a seventh embodiment of the present invention, which shows a structure thereof.

FIG. 18 is a diagrammatic sectional view of the semiconductor device according to the present embodiment. FIGS. 19A–19D are sectional views of the semiconductor device in the steps of the method for fabricating the semiconductor device, which show the method.

As shown in FIG. 18, the semiconductor device according to the present embodiment is the same as the semiconductor device according to the sixth embodiment except that the gate electrode 20 and the dummy electrode 22 are positioned oppositely to their arrangement in the sixth embodiment. In the semiconductor device having such structure, a capacitor serially connected with a capacitor $C_1$ formed by the dummy electrode 22 and a capacitor $C_2$ formed between the gate electrode 20 and the dummy electrode 22 interposing the insulation film therebetween is parallelly connected to a capacitor formed by the gate electrode 20. Accordingly, a capacitance of a capacitor parallelly connected with a capacitor formed by the gate electrode 20 can be smaller in comparison with a capacitance of a capacitor $C_1$ alone formed by the dummy electrode 22.

Next, the method for fabricating the semiconductor device according to the present embodiment will be explained with reference to FIGS. 19A–19D. FIGS. 19A–19D are sectional views of the semiconductor device along the line A–A' in FIG. 15.

Figure 19A:
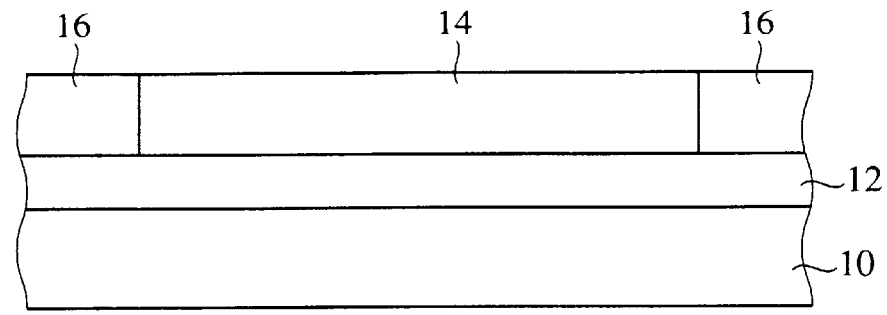
FIGS. 19A–19D are sectional views of the semiconductor device according to the seventh embodiment of the present invention in the steps of the method for fabricating the semiconductor device, which show the method.

First, the device isolation film 16 is formed down to the insulation film in the SOI layer 14 of an SOI substrate by, e.g., shallow trench isolation technique (FIG. 19A).

Next, the surface of the SOI substrate 14 is thermally oxidized by, e.g., thermal oxidation to form the gate insulation film 18 of, e.g., a 3 nm-thick on the device region.

Next, a polycrystalline silicon film of, e.g., a 200 nm-thick and a silicon oxide film of, e.g., a 150 nm-thick are deposited by, e.g., CVD method.

Figure 19B:
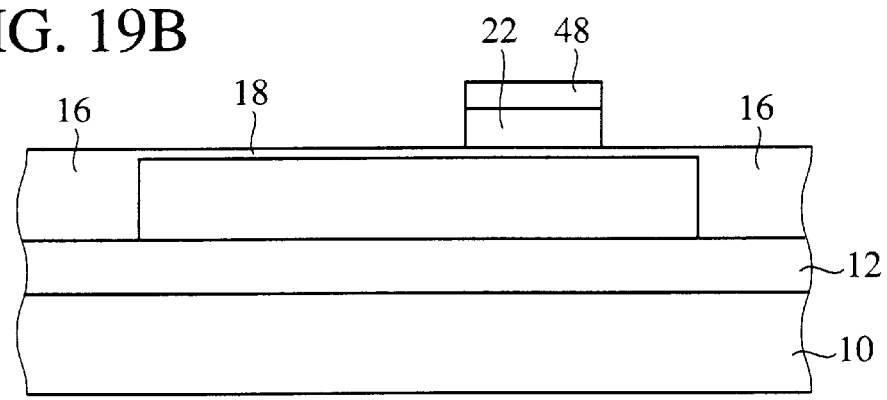

Then, the silicon oxide film and the polycrystalline silicon film are patterned by the lithography and etching to form the dummy electrode 22 of the polycrystalline silicon film and having the upper surface covered by the insulation film 48 of the silicon oxide film (FIG. 19B).

Next, a silicon oxide film of, e.g., a 150 nm-thick is deposited by, e.g., CVD method and etched back to form the sidewall insulation film 50 of the silicon oxide film on the side walls of the dummy electrode 22 and the insulation film 48.

Figure 19C:
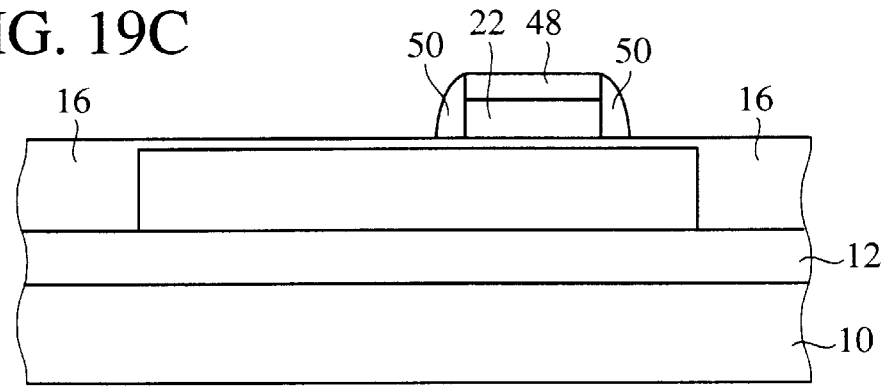

Then, the surface of the SOI layer is thermally oxidized by, e.g., thermal oxidation to again form the gate insulation film 18 of, e.g., a 3 nm-thick on the device region (FIG. 19C).

Figure 19D:
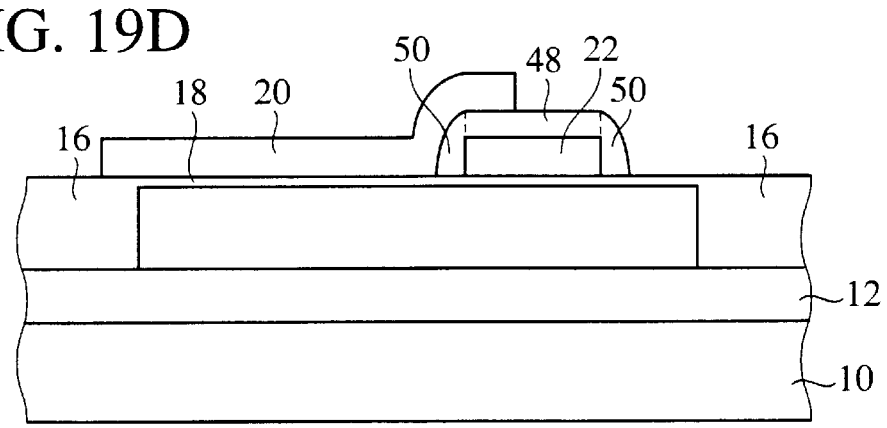

Next, a polycrystalline silicon film of, e.g., a 200 nm-thick is deposited by, e.g., CVD method and patterned by the lithography and etching to form the gate electrode 20 of the polycrystalline silicon film (FIG. 19D).

Then, the source/drain regions 32, the body contact region 36, etc. are formed in the same way as in the method for fabricating the semiconductor device according to the first embodiment exemplified in FIGS. 5D to 6C and FIGS. 8A to 8C.

As described above, according to the present embodiment, the gate electrode and the dummy electrode are formed of different conducting layers, and a capacitor formed by the gate electrode and a capacitor formed by the dummy electrode are parallelly connected with each other via a capacitor between the gate electrode and the dummy electrode, whereby a gate capacitance can be small, and accordingly deterioration of speed performance of the transistor can be suppressed.

In the semiconductor device according to the present embodiment, the gate insulation film below the gate electrode and the gate insulation film below the dummy electrode are formed of the same insulation material, but may be formed of different materials as in the semiconductor device according to, e.g., the fifth embodiment.

[An Eighth Embodiment]

The semiconductor device and the method for fabricating the same according to an eighth embodiment of the present invention will be explained with reference to FIGS. 20, 21A–21C, 22A–22D, 23A–23B, and 24A–24C. The same members of the present embodiment as those of the semiconductor device and the method for fabricating the same according to the first to the seventh embodiments are represented by the same reference numbers not to repeat or to simplify their explanation.

Figure 21A:
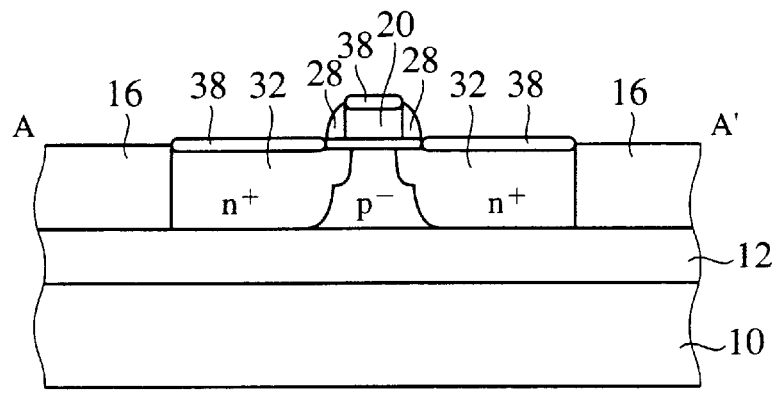
FIGS. 21A–21C are diagrammatic sectional views of the semiconductor device according to the eighth embodiment of the present invention, which show the structure thereof.
Figure 21B:
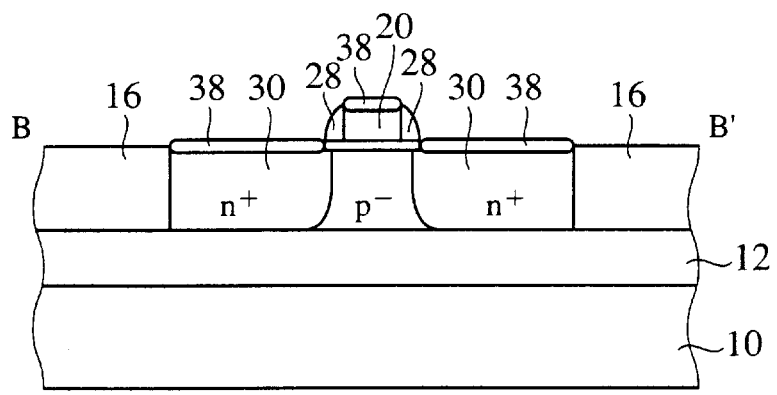
Figure 21C:
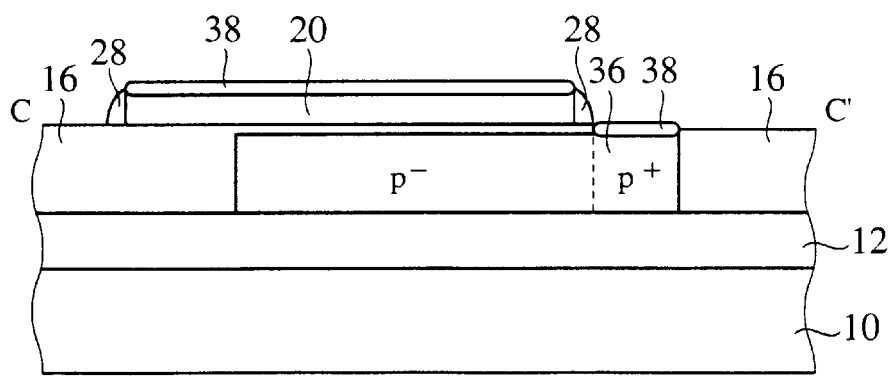

FIG. 20 is a plan view of the semiconductor device according to the present embodiment, which shows the structure thereof. FIGS. 21A–21C are diagrammatic sectional views of the semiconductor device according to the present embodiment, which shows the structure thereof. FIGS. 22A–22D, 23A–23B, and 24A–24C are sectional views of the semiconductor device according to the present embodiment in the steps of the method for fabricating the same, which show the method.

First, the structure of the semiconductor device according to the present embodiment will be explained with reference to FIGS. 20 and 21A–21C. FIG. 21A is the sectional view along the line A–A' in FIG. 20. FIG. 21B is the sectional view along the line B–B' in FIG. 20. FIG. 21C is the sectional view along the C–C' in FIG. 20.

An SOI substrate is formed of an insulation layer 12 of a silicon oxide film formed on a silicon substrate 10, and an SOI layer 14 of a single crystalline silicon layer formed on the insulation layer 12. A device isolation film 16 for defining a device region is formed in the SOI layer 14. The device region includes a MOSFET forming region 52, a body contact forming region 54, and a lead-out region 56 for leading the body contact forming region 54 from the MOSFET forming region 52. A gate electrode 20 is formed on the device region interposing a gate insulation film 16 therebetween. A sidewall insulation film 28 is formed on the side wall of the gate electrode 20. In an extension ion implantation region 58 indicated by the dotted line in FIG. 20 an n-type dopant is incorporated shallow with the gate electrode 20 as a mask, and a impurity diffused region 26 of an n$^+$-layer is formed in the device region on both sides of the gate electrode 20. An n-type dopant is incorporated deep in the source/drain ion implantation region 24 with the gate electrode 20 and the sidewall insulation film 28 as a mask. A impurity diffused region 30 is formed in the device region on both sides of the gate electrode 20. Thus, the impurity diffused regions 26, 30 form the source/drain regions 32. In a body contact ion implantation region 34 a p-type dopant is implanted with the gate electrode 20 and the sidewall insulation film 28 as a mask to form a body contact region 36 of a p$^+$-layer. A silicide film 38 is formed on the device region where the gate electrode 20 and the sidewall insulation film 28 are not formed.

The semiconductor device according to the present embodiment is characterized in that a width of the extension ion implantation region 58 along the extension of the gate electrode 20 is smaller than a width of the MOSFET forming region 52. A width of the extension ion implantation region 58 along the extension of the gate electrode 20 is smaller than a width of the MOSFET forming region 52, whereby, as shown in FIG. 21B, the impurity diffused region 26 is not formed near the device isolation film 16. Accordingly, a threshold voltage of the transistor in this region is selectively higher, and deterioration of sub-threshold characteristics near the end of the device isolation film 16 due to electric field concentration can be suppressed.

The semiconductor device according to the present embodiment is also characterized in that a width of the lead-out region 56 is smaller than a width of the gate electrodes and the sidewall insulation film 28 formed on both sides of the gate electrode 20. A width of the lead-out region 56 is thus set, whereby the lead-out region 54 is covered by the gate electrode 20 and the sidewall insulation film 28, and when the silicide film 38 is formed in the device region by salicide process, the source/drain regions 32 and the body contact region 36 are not shorted with each other.

A gate width does not depend on disalignment of the patterning for the gate electrode, whereby deviation of a gate width in the alignment can be prevented.

An area of the gate electrode, which functions as a parasitic capacitor, is smaller in comparison with that of the semiconductor devices having the T-shaped structure and the L-shaped structure, whereby a gate capacitance can be much smaller.

Figure 23A:
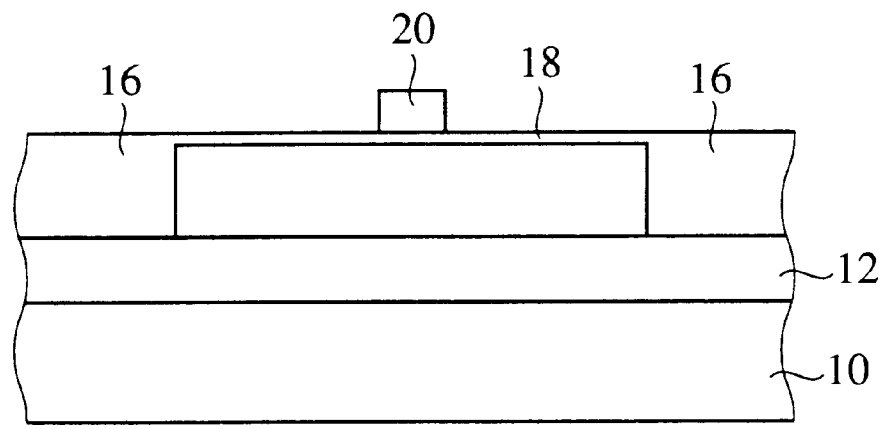
Figure 23B:
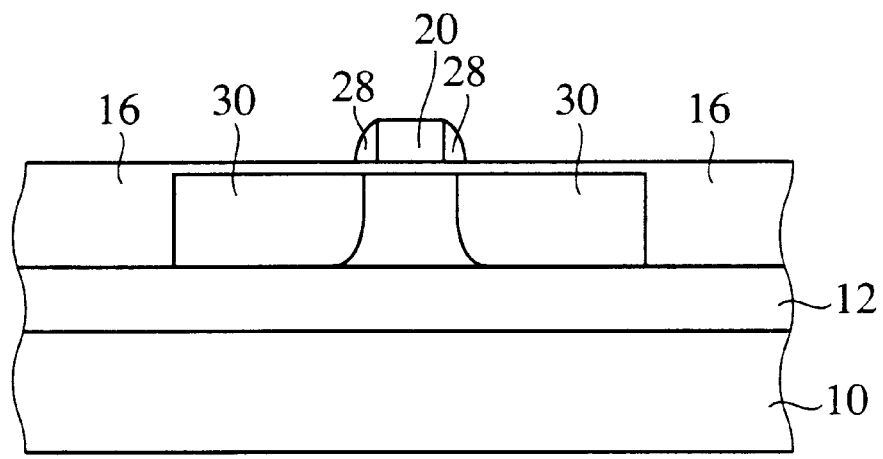
Figure 24A:
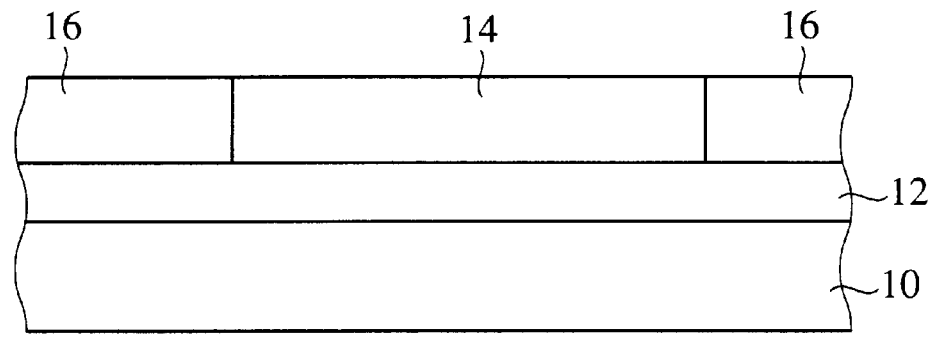
Figure 24B:
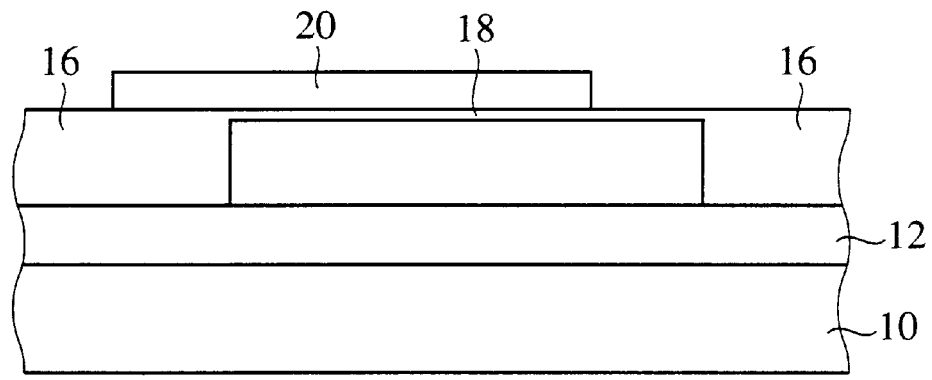
Figure 24C:
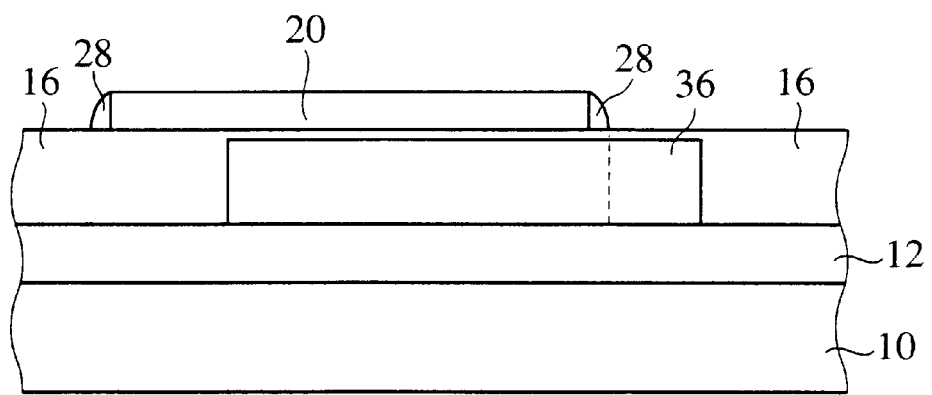

Next, the method for fabricating the semiconductor device according to the present embodiment will be explained with reference to FIGS. 22A–22D, 23A–23B, and 24A–24C. FIGS. 22A–22D are sectional views of the semiconductor device along the line A–A' in FIG. 20 in the steps of the method. FIGS. 23A–23B are sectional views of the semiconductor device along the line B–B' in FIG. 20 in the steps of the method. FIGS. 24A–24C are sectional views of the semiconductor device along the line C–C' in the steps of the method.

Figure 22A:
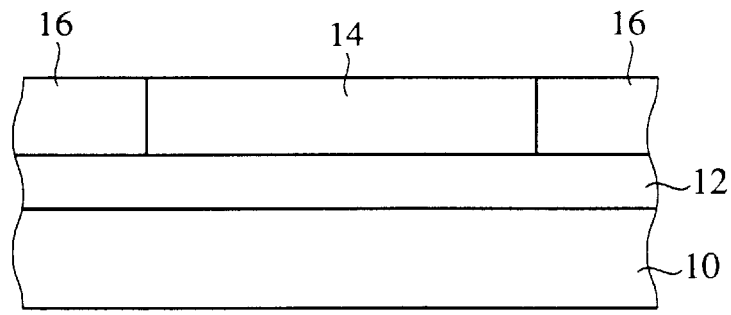
FIGS. 22A–22D, 23A–23B, and 24A–24C are sectional views of the semiconductor device according to the eighth embodiment of the present invention in the steps of the method for fabricating the same, which show the method.

First, a device isolation film 16 is formed down to the insulation film in the SOI layer 14 of an SOI substrate by, e.g., shallow trench isolation technique (FIG. 22A, FIG. 24A). Thus, a device region defined by the device isolation film 16 and including a MOSFET forming region 52, a body contact forming region 54 and a lead-out region 56 is formed.

Next, boron ions, for example, are implanted in the device region. This ion implantation is for implanting channel ions for controlling a threshold voltage of the MOSFET.

Then, the surface of the SOI layer 14 is thermally oxidized by, e.g., thermal oxidation to form the gate insulation film 18 of, e.g., 3 nm-thick on the device region.

Figure 22B:
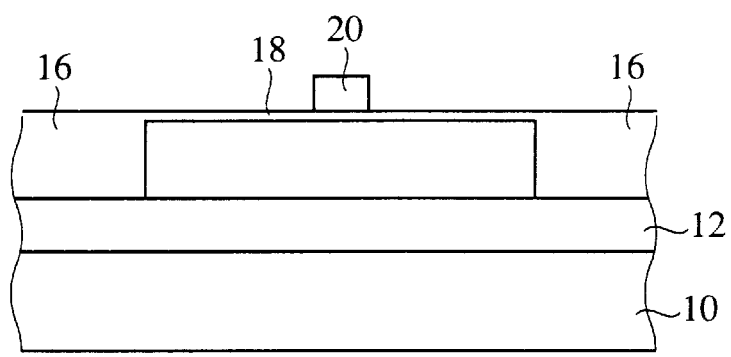

Next, a polycrystalline silicon film of, e.g., 200 nm-thick is deposited by, e.g., CVD method and patterned by the lithography and etching to form the gate electrode 20 of the polycrystalline silicon film (FIG. 22B, FIG. 24B).

Figure 22C:
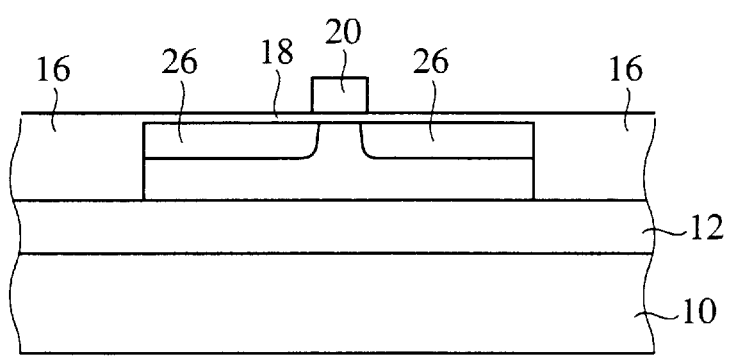

Then, arsenic ions, for example, are implanted with, as a mask, a photoresist (not shown) for exposing the extension ion implantation region 58, and the gate electrode 20 to form a shallow impurity diffused region 26 of the extension source/drain structure (or a lightly doped impurity diffused region of the LDD structure) in the device region on both sides of the gate electrode 20 (FIG. 22C). At this time, because a width of the extension ion implantation region 58 along the extension of the gate electrode 20 is smaller than a width of the MOSFET forming region 52, the impurity diffused region 26 is not formed near the device isolation film 16 (FIG. 23A).

Next, a silicon oxide film of, e.g., a 150 nm-thick is deposited by CVD method and etched back to be left only on the side wall of the gate electrode 20. Thus, the sidewall insulation film 28 of the silicon oxide film is formed on the sidewall of the gate electrode 20.

Figure 22D:
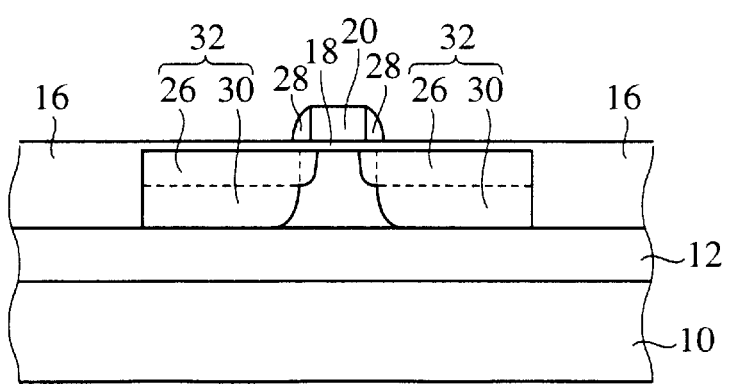

Then, with, as a mask, a photoresist (not shown) for exposing the source/drain ion implantation region 24, the gate electrode 20 and the sidewall insulation film 28, arsenic ions, for example, are implanted to form the deep impurity diffused region 30 of the extension source/drain structure (or a heavily doped impurity diffused region of the LDD structure). Thus, the source/drain regions 32 of an n$^+$-layer of the impurity diffused layers 26, 30 are formed (FIG. 22D).

At this time, because the impurity diffused region 26 is not formed near the device isolation film 16, the impurity diffused region 30 alone is formed near the device isolation film (FIG. 23B).

Next, with, as a mask, a photoresist for exposing the body contact ion implantation region 34, the gate electrode 20 and the sidewall insulation film 28, boron ions, for example, are implanted to form the body contact region 36 of a p$^+$-layer (FIG. 24C).

Then, a titanium silicide film 38 is selectively formed on the gate electrode 20 and the exposed SOI layer 14 by salicide process (FIGS. 21A, 21B, 21C). At this time, because the lead-out region 56 is covered by the gate electrode 20 and the sidewall insulation film 28, it is prevented that the silicide film 38 is formed in the lead-out region 56 and short-circuits the source/drain regions 32 with the body contact region 36.

As described above, according to the present embodiment, a gate width is not affected by disalignment in patterning of the gate electrode, whereby deviation of a gate width due to disalignment can be prevented.

The body contact region is led out from the channel region through the lead-out region of a smaller width, whereby no large-area dummy electrode covering the body region is necessary, and according a gate capacitance can be much smaller.

A width of the extension ion implantation region along the extension of the gate electrode is made smaller than a width of the MOSFET forming region, whereby the shallow impurity diffused layer of the extension source/drain structure is not formed below the gate electrode near the end of the device isolation film, and accordingly a threshold voltage of this region can be selectively increased. Accordingly, deterioration of sub-threshold characteristics near the end of the device isolation film due to electric filed concentration can be suppressed.

The lead-out region is covered by the gate electrode and the sidewall insulation film formed on both side walls of the gate electrode, whereby even when the silicide film is formed on the device region by salicide process, the source/drain regions and the body contact region are not shorted with each other.

In the present embodiment, in consideration of salicide process, a width of the lead-out region is set to be smaller than a width of the gate electrode and sidewall insulation film. However, when salicide process is not used, it is not essential to thus set a width of the lead-out region. Increase of a width of the lead-out region can lower the parasitic resistance.

In the present embodiment, the semiconductor device having the body contact has been explained. The effect of suppressing deterioration of sub-threshold characteristics by the narrow channel effect is attributed only to the technique for forming the source/drain regions. Accordingly, the present invention is applied to a semiconductor device having the device isolation film formed by STI technique so as to produce the above-described effect whether or not the semiconductor device has the body contact. The technique for forming the source/drain regions according to the present embodiment may be applied to the semiconductor device and the method for fabricating the same according to the first to the seventh embodiments.

[A Ninth Embodiment]

The semiconductor device and the method for fabricating the same according to a ninth embodiment of the present invention will be explained with reference to FIGS. 25, 26A–26C, 27A–27D, 28A–28D, and 29A–29C. The same members of the present embodiment as those of the semiconductor device and the method for fabricating the same according to the first to the eighth embodiments are represented by the same reference numbers not to repeat or to simplify their explanation.

Figure 25:
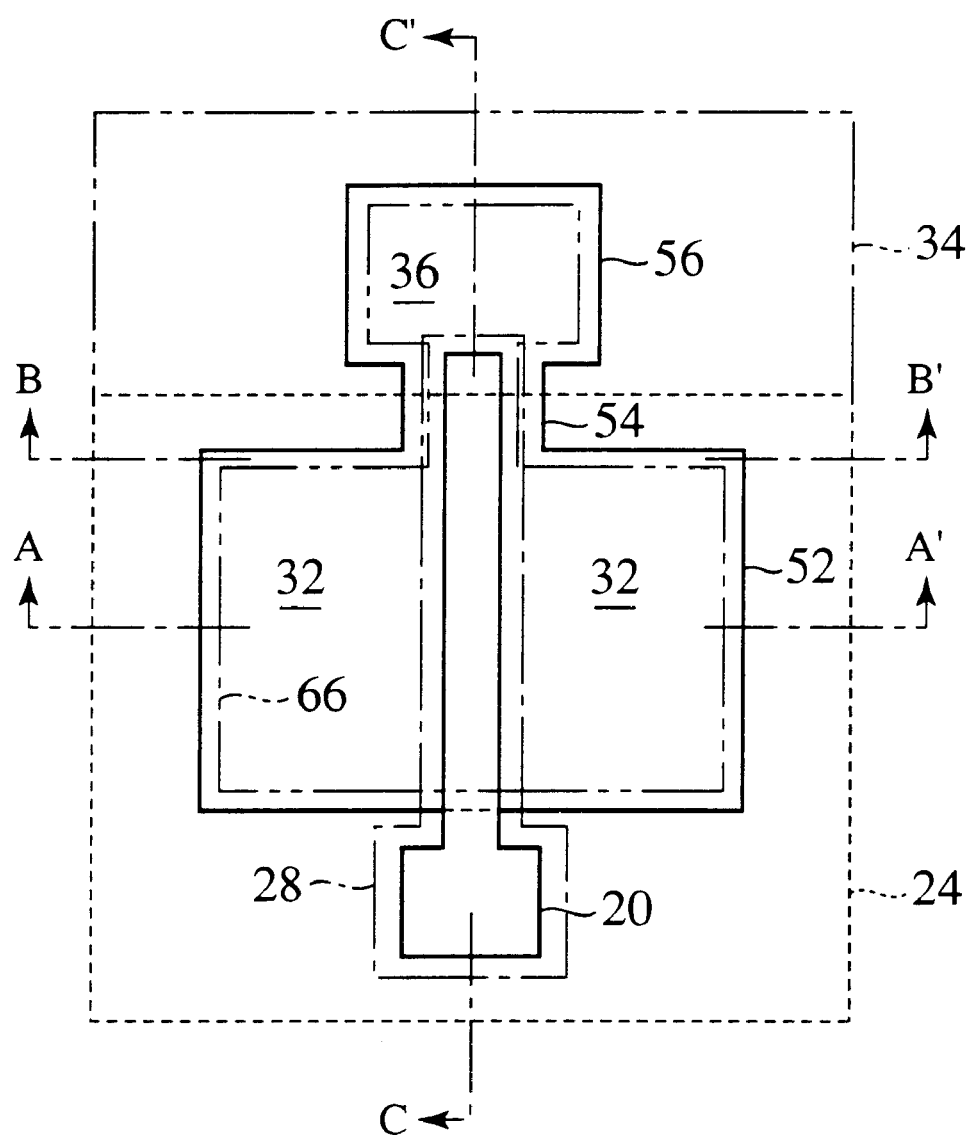
FIG. 25 is a plan view of the semiconductor device according to a ninth embodiment of the present invention, which shows a structure thereof.
Figure 26A:
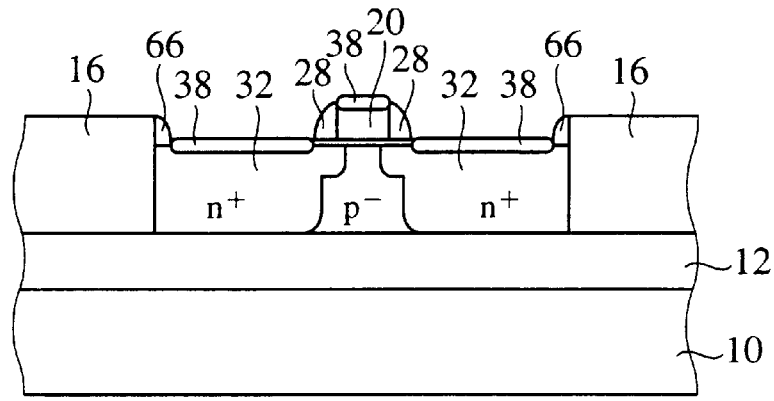
FIGS. 26A–26C are diagrammatic sectional views of the semiconductor device according to the ninth embodiment of the present invention, which show the structure thereof.
Figure 26B:
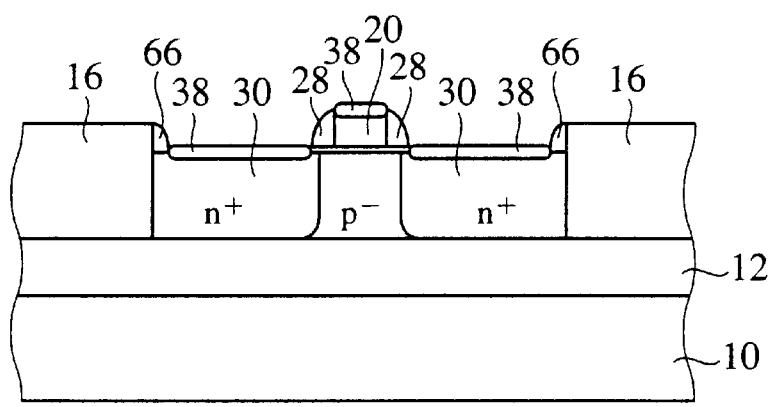
Figure 26C:
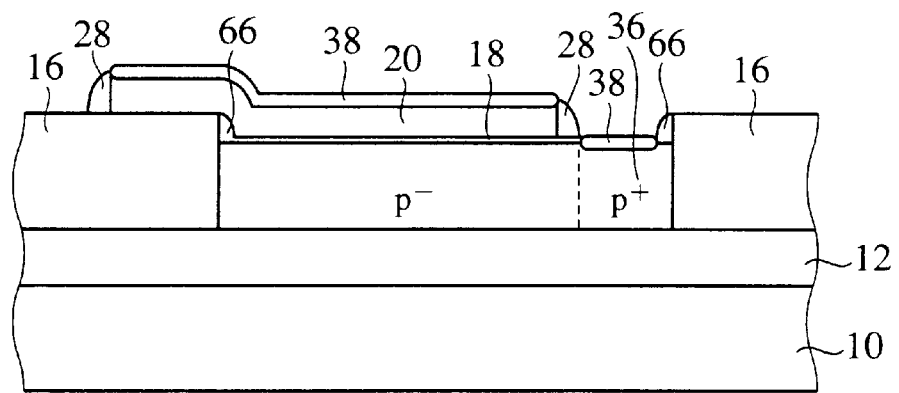

FIG. 25 is a plan view of the semiconductor device according to the present embodiment, which shows the structure thereof. FIGS. 26A–26C are sectional views of the semiconductor device according to the present embodiment, which show the structure thereof. FIGS. 27A–27D, 28A–28D, and 29A–29C are sectional views of the semiconductor device according to the present embodiment in the steps of the method for fabricating the same, which show the method.

First, the structure of the semiconductor device according to the present embodiment will be explained with reference to FIGS. 25 and 26A–26C. FIG. 26A is the sectional view along the line A–A' in FIG. 25. FIG. 26B is the sectional view along the line B–B' in FIG. 25. FIG. 26C is the sectional view along the line C–C' in FIG. 25.

An SOI substrate is formed of an insulation layer 12 of a silicon oxide film formed on a silicon substrate 10, and an SOI layer 14 of a single crystalline silicon layer formed on the insulation layer 12. A device isolation film 16 for defining a device region is formed in the SOI layer 14. The device region includes a MOSFET forming region 52, a body contact forming region 54, and a lead-out region 56 for leading out the body contact forming region 54 from the MOSFET forming region 52. A sidewall insulation film 66 is formed on a part of the side surface of the device isolation film 16. The bordering edge of the device region is covered by the sidewall insulation film 66. A gate electrode 20 is formed on the device region interposing a gate insulation film 18 therebetween. A sidewall insulation film 28 is formed on the side wall of the gate electrode 20. An n-type dopant is incorporated in source/drain ion implantation region 24 indicated by the dotted line in FIG. 25 with, as a mask, the gate electrode 20 and the sidewall insulation film 66, and the gate electrode 20 and the sidewall insulation films 28, 66 to form source/drain regions 32 of an n$^+$-layer in the device region on both sides of the gate electrode 20. A p-type dopant is incorporated in the body contact ion implantation region 34 with, as a mask, the gate electrode 20 and the sidewall insulation films 28, 66 to form the body contact region 36 of an p$^+$-layer. A silicide film 38 is formed on the device region where the gate electrode 20, the sidewall insulation films 28, 66 are not formed.

The semiconductor device according to the present embodiment is characterized in that the sidewall insulation film 66 is formed on a part of the side surface of the device isolation film 16, and the impurity diffused region 26 is not formed on the bordering edge of the device region (FIG. 26B). The semiconductor device having such structure can have a threshold voltage at the bordering edge of the device region increased. Accordingly, deterioration of sub-threshold characteristics near the end of the device isolation film due to electric field concentration can be suppressed.

As in the semiconductor device according to the eighth embodiment, a gate width does not depend on a pattern of the gate electrode 20, and accordingly even when disalignment takes place in patterning the gate electrode 20, a gate width is not deviated.

The semiconductor device according to the present embodiment is characterized in that a width of the lead-out region 56 is smaller than a width of the gate electrode 20 and sidewall insulation films 28, 66. A width of the lead-out region 56 is thus set, whereby the lead-out region 56 is covered by the gate electrode 20 and the sidewall insulation films 28, 66, whereby when a silicide film 38 is formed on the device region by salicide process, the source/drain regions 32 and the body contact region 36 are not shorted with each other. In comparison with the semiconductor device according to the eighth embodiment, the lead-out region 56 can have a width which is larger by the sidewall insulation film 66, whereby a parasitic resistance can be low.

The gate electrode has an area which is smaller in comparison with that of the semiconductor devices having the T-shaped and the L-shaped structures, whereby a gate capacitance is much decreased.

Next, the method for fabricating the semiconductor device according to the present embodiment will be explained with reference to FIGS. 27A–27D, 28A–28D, and 29A–29C. FIGS. 27A–27D and 28A–28D are sectional views of the semiconductor device along the line A–A' in FIG. 25 in the steps of the method for fabricating the same. FIGS. 29A–29C are the sectional views of the semiconductor device along the line C–C' in FIG. 25 in the steps of the method for fabricating the same.

First, a silicon oxide film 60 is formed on the SOI layer 14 by thermal oxidation.

Next, a 150 nm-thick silicon nitride film 62 is formed on the silicon oxide film 60 by, e.g., CVD method. A thickness of the silicon nitride film 62 is suitably set in accordance with ion implanting conditions for impurity diffused regions 26, 30 as will be described later.

Figure 27A:
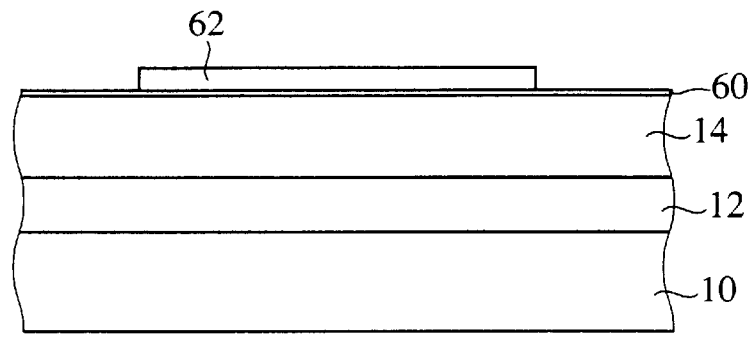
FIGS. 27A–27D, 28A–28D, and 29A–29C are sectional views of the semiconductor device according to the ninth embodiment of the present invention in the steps of the method for fabricating the same, which show the method.
Figure 28A:
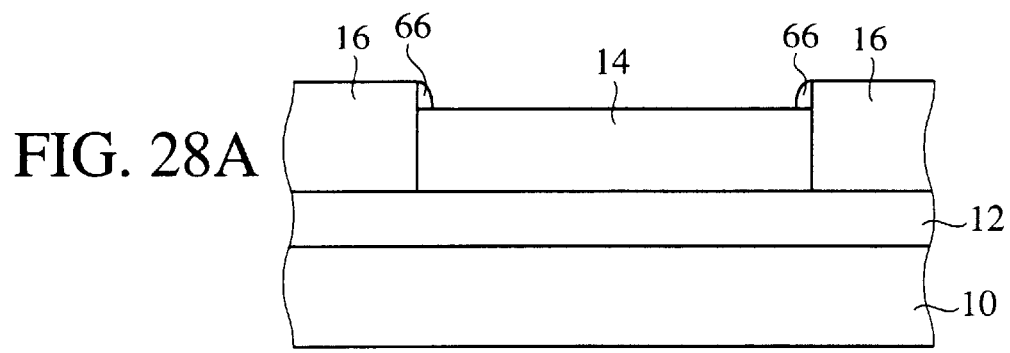

Next, the silicon nitride film 62 is patterned by the lithography and etching to be left selectively in the region to be the device region (FIG. 27A).

Figure 27B:
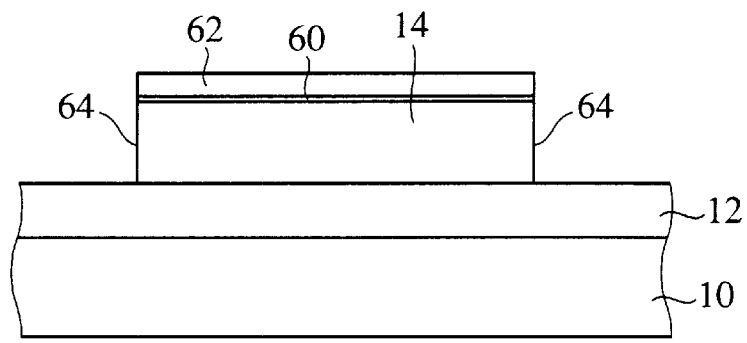

Then, with the silicon nitride film 62 as a mask, the device isolation trench 64 is formed in the SOI layer 14 down to the insulation layer 12 (FIG. 27B).

Figure 27C:
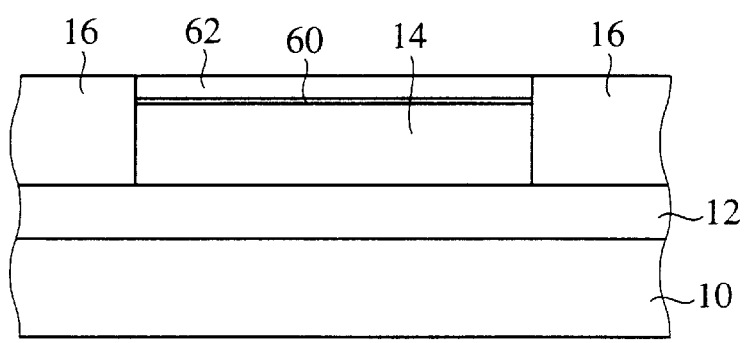

Then, a silicon oxide film is deposited by, e.g., CVD method in a thickness combining a film thickness of the SOI layer 14 and, e.g., a 300 nm-thick. Then, the silicon oxide film is polished by, e.g., CMP to expose the surface of the silicon nitride film and to form the device isolation film 16 of the silicon oxide film buried in a device isolation trench 64 (FIG. 27C). Before the deposition of the silicon oxide film, a thermal oxidation film may be formed on the inside wall of the device isolation trench 64.

Figure 27D:
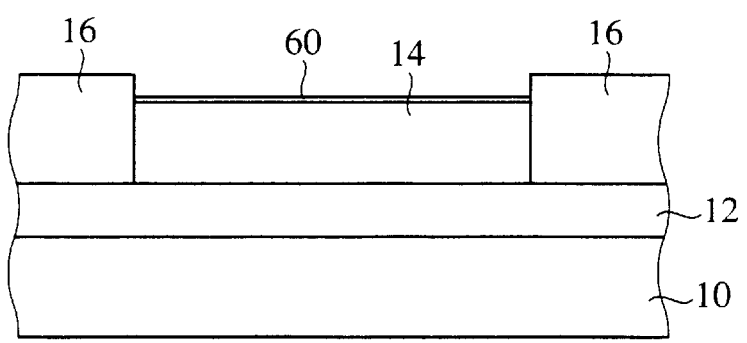

The device isolation film 16 is thus formed by the so-called shallow trench isolation technique, and then the silicon nitride film 62 remaining in the region to be the device region is selectively removed. At this time, a height level of the surface of the device isolation film 16 is higher by a film thickness of the silicon nitride film 62 than a height level of the surface of the device region (FIG. 27D).

Next, a 150 nm-thick silicon oxide film is deposited by, e.g., CVD method and is etched back to form the sidewall insulation film 66 of the silicon oxide film on a side wall of the device isolation film 16. The sidewall insulation film 66 is formed, covering the bordering edge of the device region (FIG. 28A, FIG. 29A).

Then, the surface of the SOI layer 14 is thermally oxidized by, e.g., thermal oxidation to form the gate insulation film 18 of, e.g., a 3 nm-thick in the device region.

Figure 28B:
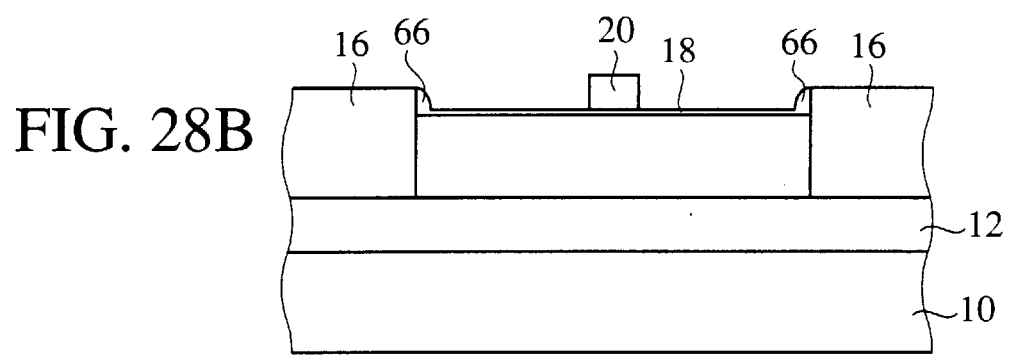
Figure 29A:
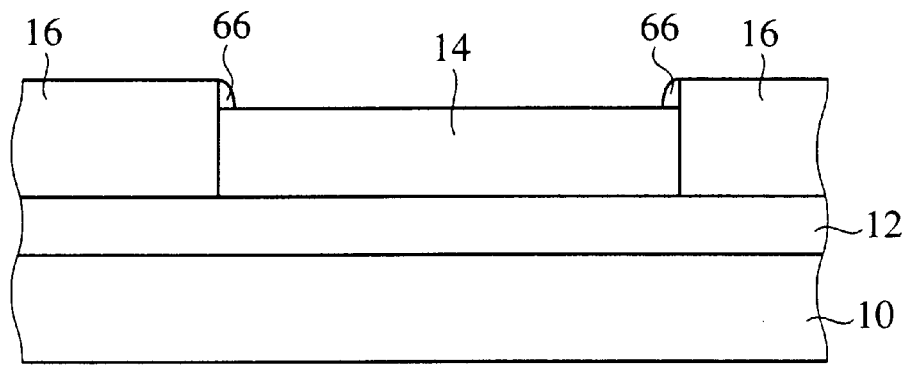
Figure 29B:
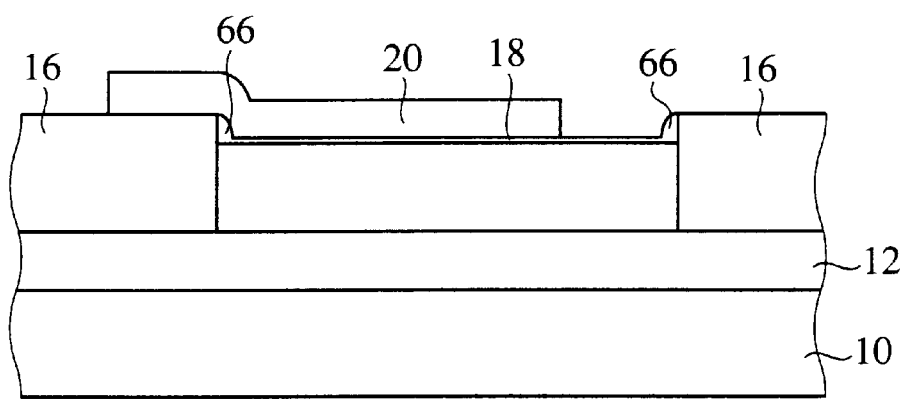
Figure 29C:
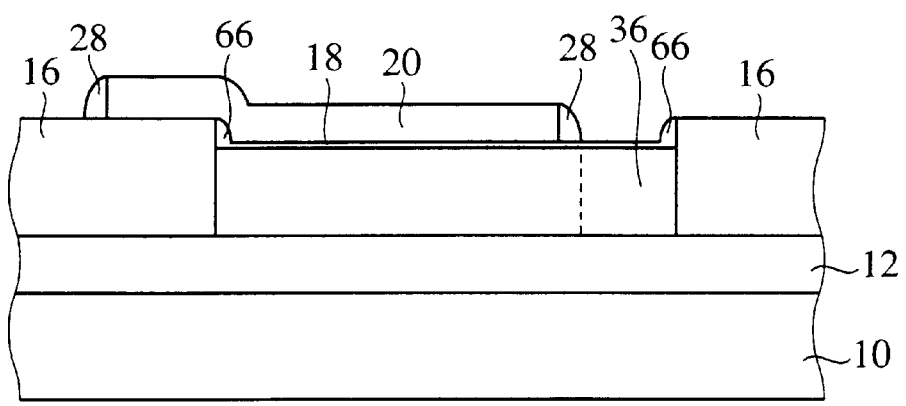

Next, a polycrystalline silicon film of, e.g., a 200 nm-thick is formed by, e.g., CVD method and patterned by the lithography and etching to form the gate electrode 20 of the polycrystalline silicon film (FIG. 28B, FIG. 29B).

Figure 28C:
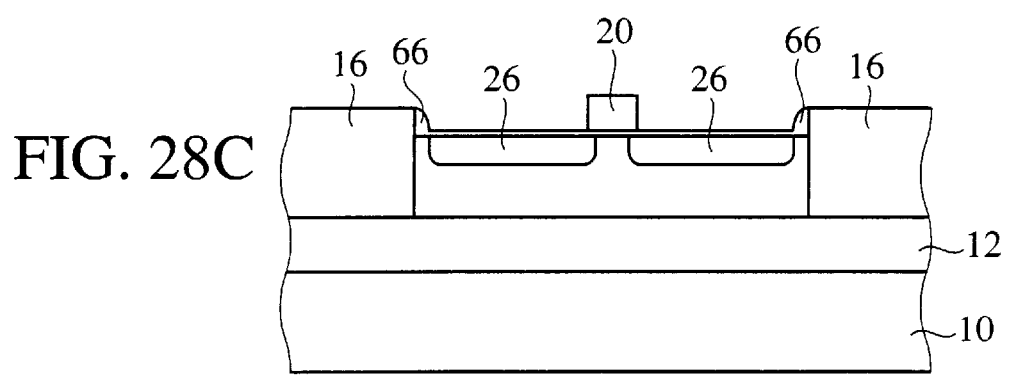

Next, with, as a mask, a photoresist for exposing the source/drain ion implantation region 24, and the gate electrode 20, arsenic ions, for example, are implanted to form the shallow impurity diffused region 26 of the extension source/drain structure (or a lightly doped impurity diffused region of the LDD structure) in the device region on both sides of the gate electrode 20. At this time, the sidewall insulation film 66 covering the bordering edge of the device region on a part of the side wall of the device isolation film 16 is formed, whereby the impurity diffused region 26 is not formed in the device region near the device isolation film 16 (FIG. 28C).

A film thickness of the sidewall insulation film 66 must be set so that, in the step of the ion implantation for forming the shallow impurity diffused region 26 of the extension source/drain structure, the implanted ions are prohibited from passing the sidewall insulation film 66 into the device region therebelow. Unless the conduction type of the device region below the sidewall insulation film 66 is not reversed from p-type fully to n-type, all of the implanted ions are not essentially prohibited.

A thickness and a width of the sidewall insulation film 66 depend on a film thickness of the silicon nitride film 62 used in forming the device isolation film 16. Accordingly, a film thickness of the silicon nitride film 62 is controlled in accordance with ion implanting conditions for forming the impurity diffused region 26 so that the implanted ions do not pass the sidewall insulation film 66.

Next, a silicon oxide film of, e.g., a 150 nm-thick is deposited by CVD method and etched back to be left only on the side wall of the gate electrode 20. Thus, the sidewall insulation film 28 of the silicon oxide film is formed on the side wall of the gate electrode 20.

Figure 28D:
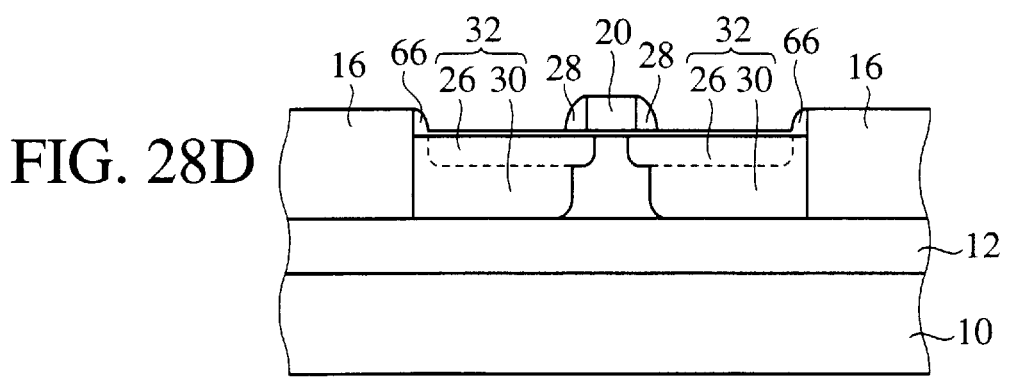

Then, with, as a mask, a photoresist (not shown) for exposing the source/drain ion implantation region 24, the gate electrode 20 and the sidewall insulation films 28, 66, arsenic ions, for example, are implanted to form the deep impurity diffused region 30 of the extension source/drain structure (or a heavily doped impurity diffused region of the LDD structure) in the device regions on both sides of the gate electrode 20. Thus, the source/drain regions 32 of an n-layer formed by the impurity diffused layers 26, 30 are formed (FIG. 28D).

It is preferable that a film thickness of the sidewall insulation film 66 is set so that, in the step of the ion implantation for forming the deep impurity diffused region 30 of the extension source/drain structure, the implanted ions are implanted through the sidewall insulation film 66 into the device region therebelow.

Next, boron ions, for example are implanted with, as a mask, a photoresist for exposing the body contact ion implantation region 34, the gate electrode 20 and the sidewall insulation films 28, 66 to form the body contact region 36 of a $p^+$-layer (FIG. 29C).

Then, titanium silicide film 38 is formed by salicide process selectively on the gate electrode 20 and the exposed SOI layer (FIGS. 26A, 26B and 26C). At this time, the lead-out region 56 is covered by the gate electrode 20 and the sidewall insulation film 28,66, it is prevented that the silicide film 38 is formed in the lead-out region 56, and the source/drain regions 32 and the body contact region 36 shorted with each other.

As described above, according to the present embodiment, a gate width is not affected by disalignment of the patterning for the gate electrode, and accordingly gate width deviation in the alignment can be prevented.

The body contact region is led out from the channel region through the narrow lead-out region, whereby no dummy electrode of a large area covering the body region is necessary. Accordingly, a gate capacitance is much decreased.

The sidewall insulation film is formed on a part of the side wall of the device isolation film, whereby the shallow impurity diffused region of the extension source/drain structure is not formed below the gate electrode near the end of the device isolation film. Accordingly, a threshold voltage in this region can be selectively increased. Thus, deterioration of sub-threshold characteristics due to electric field concentration near the end of the device isolation film can be suppressed.

Especially in the method for fabricating the semiconductor device according to the present embodiment, a mask used in forming the impurity diffused region 26 can be used as a mask for forming the impurity diffused region 30. Accordingly, it is not necessary to prepare another mask for forming the impurity diffused region 26, as is in the method for fabricating the semiconductor device according to the eighth embodiment.

The lead-out region is covered by the gate electrode and the sidewall insulation film formed on both side walls of the gate electrode, the sidewall insulation film formed on a part of the side surface of the device isolation film, whereby when a silicide film is formed on the device region by salicide process, the source/drain regions and the body contact region are not shorted with each other.

In the present embodiment, a width of the lead-out region is set to be smaller than a width of the gate electrode and the sidewall insulation film. However, in a case that salicide process is not used, it is not essential to thus set a width of the lead-out region. Increase of a width of the lead-out region can decrease the parasitic resistance.

In the present embodiment, the semiconductor device having the body contact has been explained. The effect of suppressing deterioration of sub-threshold characteristics by the narrow channel effect is attributed only to the technique for forming the source/drain regions. Accordingly, the present invention is applied to a semiconductor device having the device isolation film formed by STI technique so as to produce the above-described effect whether or not the semiconductor device has the body contact. The technique for forming the source/drain regions according to the present embodiment may be applied to the semiconductor device and the method for fabricating the same according to the first to the seventh embodiments.

[Modifications]

The present invention is not limited to the above-described embodiments and covers other various modifications.

For example, in the above-described embodiments, the present invention has bee explained by means of the body contact of MOSFETs formed on SOI substrates, but is applicable to body contacts of MOSFETs formed on bulk substrates. The present invention can produce the conspicuous effects by being applied to the semiconductor devices using SOI substrates, which are difficult to make body contacts in comparison with bulk substrates, and makes no problem in being applied to semiconductor devices using bulk substrates.

In the above-described embodiments, the silicide film is formed on the gate electrode and the SOI layer. However, the silicide film may be formed only on the SOI layer, and in this case, before the salicide step, a film which prohibits reaction between a metal to be silicide and a gate electrode, such as a silicon oxide film, a silicon nitride film or others may be formed on the gate electrode.

In the above-described embodiments, the present invention has been explained by means of applications to N-type MOSFET, but the present invention is applicable to P-type MOSFET in the same way. In the above-described embodiments, MOSFET is exemplified as a typical device of MISFET, and the present invention is not limited to MOSFET. The present invention is applicable widely to field-effect transistors which require body contacts.

What is claimed is:

1. A semiconductor device comprising:
    a semiconductor layer including: a channel region; a source region and a drain region sandwiching the channel region; and a body region connected to the channel region and being adjacent to the source region and the drain region;
    a gate electrode formed above the channel region interposing a gate insulation film therebetween;
    a dummy electrode formed above the body region near an interface between the drain region and the body region, and electrically insulated with the gate electrode; and
    a body contact region formed in the body region except a region where the dummy electrode is formed.

2. A semiconductor device according to claim 1, wherein the dummy electrode is extended above the body region near an interface between the source region and the body region.

3. A semiconductor device according to claim 1, wherein the gate electrode and the dummy electrode are formed of the same conducting layer.

4. A semiconductor device according to claim 1, further comprising:
    a silicide film formed on the semiconductor layer except a region between the gate electrode and the dummy electrode.

5. A semiconductor device according to claim 1, wherein the gate electrode and the dummy electrode are formed of different conducting layers from each other.

6. A semiconductor device comprising:
    a semiconductor layer including: a channel region; a source region and a drain region sandwiching the channel region; and a body region connected to the channel region and being adjacent to the source region and the drain region;
    a gate electrode formed above the channel region interposing a gate insulation film therebetween;
    a dummy electrode formed above the body region near an interface between the drain region and the body region, being integral with the gate electrode, and formed in a comb-shaped; and
    a body contact region formed in the body region except a region where the dummy electrode is formed.

7. A semiconductor device comprising:
    a semiconductor layer including: a channel region; a source region and a drain region sandwiching the channel region; and a body region connected to the channel region and being adjacent to the source region and the drain region;
    a gate electrode formed above the channel region interposing a gate insulation film therebetween;
    a dummy electrode formed above the body region near an interface between the drain region and the body region, being integral with the gate electrode, and formed in a pattern having an inside portion therefor cut out; and
    a body contact region formed in the body region except a region where the dummy electrode is formed.

8. A semiconductor device according to claim 6, further comprising:
a silicide film formed on the semiconductor layer except that in gaps between the comb-shaped dummy electrode.

9. A semiconductor device according to claim 7, further comprising:
a silicide film formed on the semiconductor layer except that in a cut-out region of the dummy electrode.

10. A semiconductor device comprising:
a semiconductor layer including: a channel region; a source region and a drain region sandwiching the channel region; and a body region connected to the channel region and being adjacent to the source region and the drain region;
a gate electrode formed above the channel region interposing a gate insulation film therebetween;
a dummy electrode formed above the body region near an interface between the drain region and the body region, and being integral with the gate electrode; and
a body contact region formed in the body region except a region where the dummy electrode is formed,
a capacitance per a unit area of a capacitor formed by the dummy electrode being smaller than a capacitance per the unit area of a capacitor formed by the gate electrode.

11. A semiconductor device comprising:
a semiconductor layer including:
a channel region;
source region and a drain region sandwiching the channel region;
a body contact region; and
a lead-out region interconnecting the channel region and the body contact region; a device isolation film formed, surrounding the bordering edge of the semiconductor layer;
a gate electrode formed above the channel region interposing a gate insulation film therebetween; and
a first sidewall insulation film formed on a side wall of the gate electrode,
a width of the lead-out region being smaller than a sum of a width of the gate electrode and a width of the first sidewall insulation film formed on both sides of the gate electrode, and the lead-out region being insulated with the first sidewall insulation film.

12. A semiconductor device according to claim 11, wherein the source/drain regions each includes:
a first impurity diffused region formed, spaced from a vicinity of a region below the gate electrode; and
a second impurity diffused region extended from a vicinity of a region below the gate electrode, and being shallower than the first impurity diffused region,
the second impurity diffused region being spaced from the device isolation film.

13. A semiconductor device comprising:
a semiconductor layer including:
a channel region;
source/drain regions sandwiching the channel region;
a body contact region; and
a lead-out region interconnecting the channel region and the body contact region;
a device isolation film formed, surrounding the bordering edge of the semiconductor layer;
a gate electrode formed above the channel region interposing a gate insulation film therebetween;
a first sidewall insulation film formed on a side wall of the gate electrode; and
a second sidewall insulation film formed on a side wall of the device isolation film, and covering the bordering edge of the semiconductor layer;
a width of the lead-out region being smaller than a sum of a width of the gate electrode, a width of the first sidewall insulation film formed on both side walls of the gate electrode and a width of the second sidewall insulation film formed on both side walls of the device isolation film, and the lead-out region being insulated with the first sidewall insulation film and the second sidewall insulation film.

14. A semiconductor device according to claim 13, wherein the source/drain regions each includes: a first impurity diffused region formed, spaced from a vicinity of a region below the gate electrode; and a second impurity diffused region extended from a vicinity of a region below the gate electrode, and being shallower than the first impurity diffused region,
the second impurity diffused region being spaced from the device isolation film.

15. A semiconductor device comprising:
a semiconductor layer including:
a first channel region;
a first source/drain region and a second source/drain region sandwiching the first channel region;
a second channel region;
a third source/drain region sandwiching the second channel region with the second source/drain region; and
a body region connected to the first channel region and the second channel region, being adjacent to the second source/drain region;
a first gate electrode formed above the first channel region interposing a first gate insulation film therebetween;
a second gate electrode formed above the second channel region interposing a second gate insulation film therebetween;
a dummy electrode formed above the body region, and electrically insulated with the first gate electrode and the second gate electrode; and
a body contact region formed in the body region except a region where the dummy electrode is formed.

16. A semiconductor device according to claim 15, wherein the dummy electrode is in common with a first transistor having the first gate electrode and a second transistor having the second gate electrode.

17. A semiconductor device comprising:
a semiconductor layer including:
a channel region;
source/drain regions sandwiching the channel region; and
a body region connected to the channel region and being adjacent to the source/drain regions;
a gate electrode formed above the channel region interposing a gate insulation film therebetween;
a dummy electrode formed above the body region, extending to a perpendicular direction of an extension of the gate electrode, having a concave surrounding the gate electrode partly, and electrically insulated from the gate electrode; and
a body contact region formed in the body region.

18. A semiconductor device according to claim 17, further comprising:
a silicide film formed on the semiconductor layer except a region between the gate electrode and the dummy electrode.

* * * * *